(12) United States Patent
Watanabe et al.

(10) Patent No.: US 7,718,490 B2
(45) Date of Patent: May 18, 2010

(54) NONVOLATILE SEMICONDUCTOR STORAGE DEVICE AND MANUFACTURING METHOD THEREFOR

(75) Inventors: Hiroshi Watanabe, Yokohama (JP); Atsuhiro Kinoshita, Kamakura (JP); Akira Takashima, Tokyo (JP); Daisuke Hagishima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/318,493

(22) Filed: Dec. 30, 2008

(65) Prior Publication Data
US 2009/0186474 A1    Jul. 23, 2009

Related U.S. Application Data

(62) Division of application No. 11/224,049, filed on Sep. 13, 2005, now Pat. No. 7,489,006.

(30) Foreign Application Priority Data
Mar. 24, 2005    (JP)    ............... 2005-086803

(51) Int. Cl.
*H01L 21/336*    (2006.01)
*H01L 29/788*    (2006.01)
(52) U.S. Cl. ..................... 438/260; 257/317
(58) Field of Classification Search ......... 438/257–264, 438/593–594; 257/314–317, E29.137–E29.147
See application file for complete search history.

(56) References Cited

U.S. PATENT DOCUMENTS

| | | | |
|---|---|---|---|
| 5,498,560 A * | 3/1996 | Sharma et al. ............. | 438/261 |
| 5,644,152 A | 7/1997 | Rostoker et al. | |
| 5,869,858 A | 2/1999 | Ozawa et al. | |
| 6,365,459 B1 * | 4/2002 | Leu ........................... | 438/266 |
| 6,441,430 B1 * | 8/2002 | Tanigami ................... | 257/317 |

(Continued)

FOREIGN PATENT DOCUMENTS

JP    10-12750    1/1998

(Continued)

OTHER PUBLICATIONS

Notification of Reasons for Rejection issued by the Japanese Patent Office on Jul. 10, 2009, for Japanese Patent Application No. 2005-086803, and English-language translation thereof.

(Continued)

*Primary Examiner*—Calvin Lee
(74) *Attorney, Agent, or Firm*—Finnegan, Henderson, Farabow, Garrett & Dunner, L.L.P.

(57) ABSTRACT

A nonvolatile semiconductor storage device includes a semiconductor substrate; a plurality of isolation regions formed in the semiconductor substrate; an element-forming region formed between adjacent isolation regions; a first gate insulating film provided on the element-forming region; a floating gate electrode which is provided on the first gate insulating film and in which a width of a lower hem facing the element-forming region is narrower than a width of the element-forming region in a section taken in a direction perpendicular to a direction in which the isolation regions extend; a second gate insulating film provided on the floating gate electrode; and a control gate electrode provided on the second gate insulating film.

10 Claims, 27 Drawing Sheets

U.S. PATENT DOCUMENTS

| | | | |
|---|---|---|---|
| 6,555,434 | B2 | 4/2003 | Koh |
| 6,624,464 | B2 * | 9/2003 | Shin et al. .................. 257/314 |
| 7,189,618 | B2 | 3/2007 | Lee |
| 2005/0127451 | A1 | 6/2005 | Tsuchiya et al. |

FOREIGN PATENT DOCUMENTS

| | | |
|---|---|---|
| JP | 2002-110830 | 4/2002 |
| JP | 2002-134634 | 5/2002 |
| JP | 2002-270705 | 9/2002 |

OTHER PUBLICATIONS

Decision of Final Rejection issued by the Japanese Patent Office on Oct. 2, 2009, for Japanese Patent Application No. 2005-086803, and English-language translation thereof.

Notification of the First Office Action issued by the Chinese Patent Office on Mar. 7, 2008, for Chinese Patent Application No. 200610068044.3, and English-language translation thereof.

Patent Office Notification or Argument Submission issued by the Korean Patent Office on Apr. 23, 2007, for Korean Patent Application No. 10-2006-26458, and English-language translation.

Hieda, et al., "Semiconductor Device and Method of Manufacture Thereof", U.S. Appl. No. 11/064,453, filed Feb. 24, 2005.

Ichige, et al., "A novel self-aligned shallow trench isolation cell for 90nm 4Gbit NAND Flash EEPROMs", Symposium on VLSI Technology Digest of Technical Papers, pp. 89-90, (2003).

Takeuchi, et al., "A Self-Aligned STI Process Integration for Low Cost and Highly Reliable 1Gbit Flash Memories", Symposium on VLSI Technology Digest of Technical Papers, pp. 102-103, (1998).

* cited by examiner

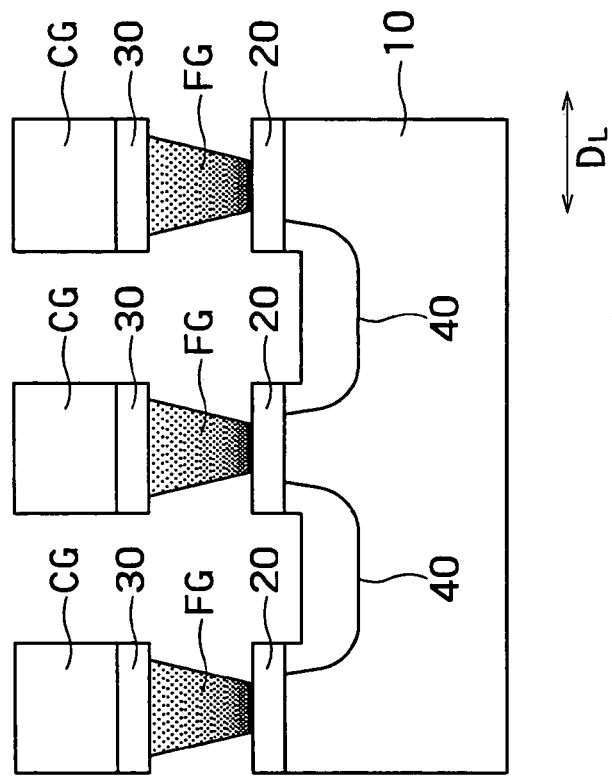
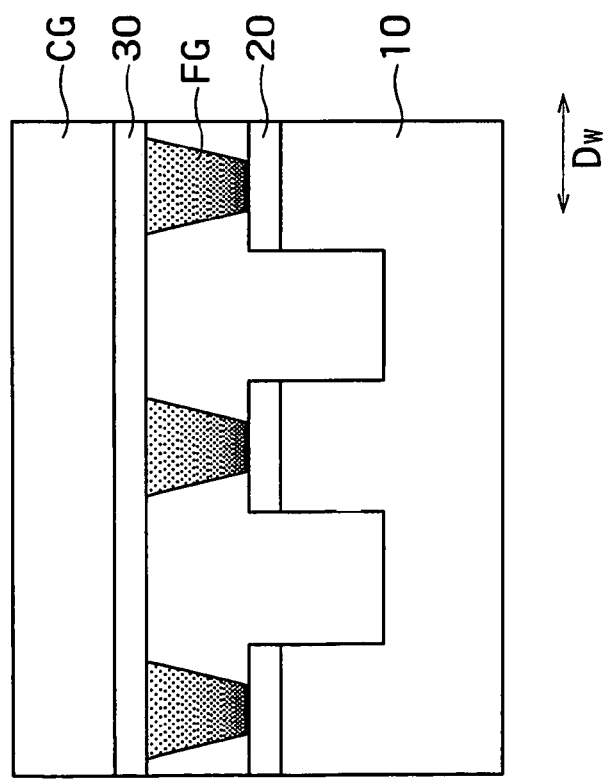
FIG. 18B
FIG. 18A

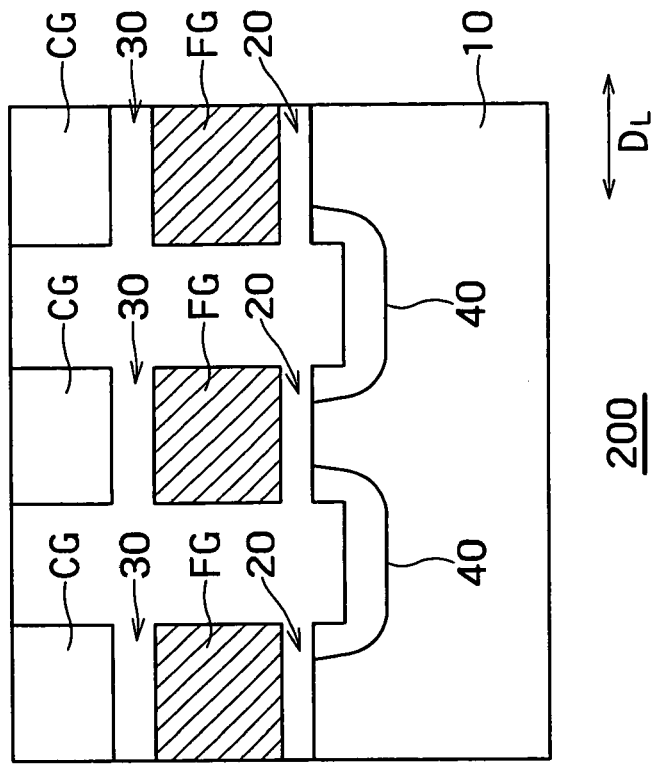
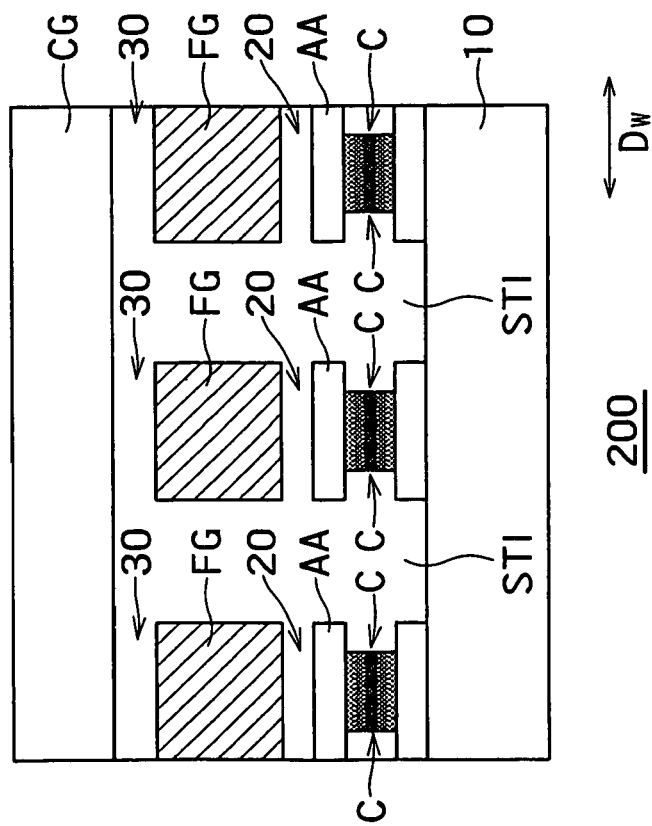
FIG. 19A
FIG. 19B

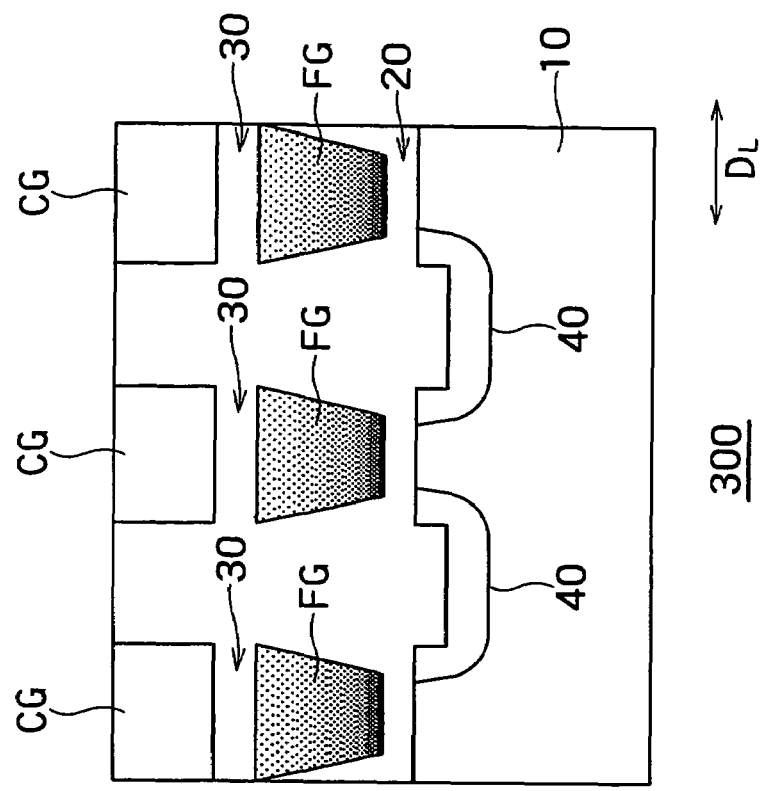
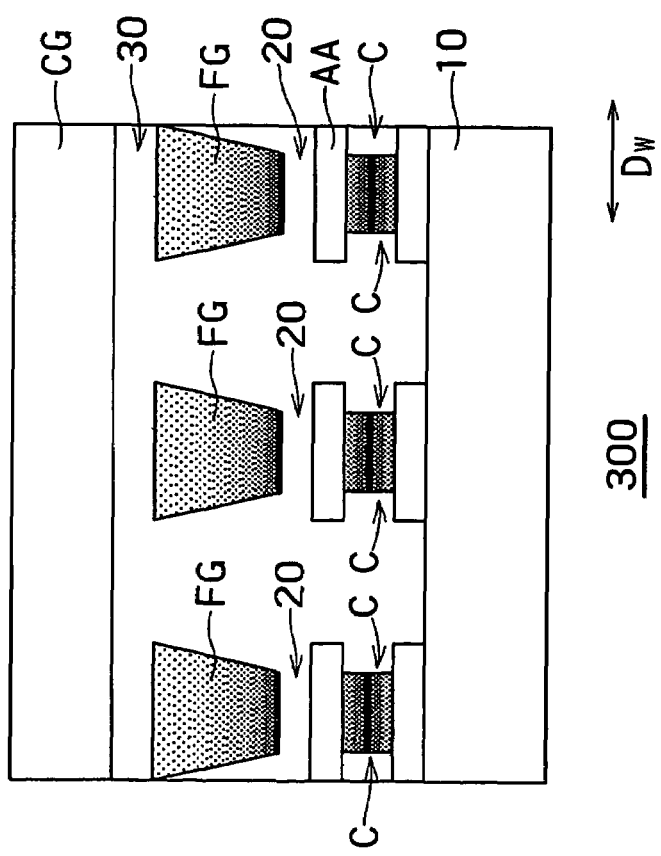
FIG. 23B
FIG. 23A

US 7,718,490 B2

NONVOLATILE SEMICONDUCTOR STORAGE DEVICE AND MANUFACTURING METHOD THEREFOR

CROSS-REFERENCE TO RELATED APPLICATION

This is a division of application Ser. No. 11/224,049, filed Sep. 13, 2005, now U.S. Pat. No. 7,489,006 which is incorporated herein by reference.

This application is based upon and claims the benefit of priority from the prior Japanese Patent Applications No. 2005-86803, filed on Mar. 24, 2005, the entire contents of which are incorporated herein by reference.

BACKGROUND OF THE INVENTION

1. Field of the Invention

The present invention relates to a nonvolatile semiconductor storage device and manufacturing method therefor.

2. Background Art

Since a NAND-type flash memory leaves bit line control to a selection transistor, it can be made smaller in cell area than a NOR-type flash or DRAM. Thus, NAND-type flash memories can be manufactured at a low cost.

However, as NAND-type flash memories are being miniaturized, the spacing between memory cells (the width of an STI) decreases with a decrease in size of memory cells. This produces the proximity effect in memory cells and causes interference between memory cells. Interference between memory cells acts to average the potentials of adjacent floating gate electrodes. Accordingly, a threshold difference ($\Delta V_{TH}$) narrows between a state wherein data is written and a state wherein data is erased, thus resulting in a data write failure.

SUMMARY OF THE INVENTION

An advantage of an aspect of the present invention is to provide a nonvolatile semiconductor storage device which reduces interference between memory cells caused by miniaturization and can easily control the capacitive coupling ratio between the memory cells in order to solve the above-described problem.

A nonvolatile semiconductor storage device according to an embodiment of the present invention comprises a semiconductor substrate; a plurality of isolation regions formed in the semiconductor substrate; an element-forming region formed between adjacent isolation regions; a first gate insulating film provided on the element-forming region; a floating gate electrode which is provided on the first gate insulating film and in which a width of a lower hem facing the element-forming region is narrower than a width of the element-forming region in a section taken in a direction perpendicular to a direction in which the isolation regions extend; a second gate insulating film provided on the floating gate electrode; and a control gate electrode provided on the second gate insulating film.

A nonvolatile semiconductor storage device according to an embodiment of the present invention comprises a semiconductor substrate; a plurality of isolation regions formed in the semiconductor substrate; an element-forming region formed between adjacent isolation regions; a first gate insulating film provided on the element-forming region; a floating gate electrode provided on the first gate insulating film; a second gate insulating film provided on the floating gate electrode; and a control gate electrode provided on the second gate insulating film, wherein a width of at least a part of a body of the element-forming region is narrower than a width of a top surface of the element-forming region in a section taken in a direction perpendicular to a direction in which the isolation regions extend.

A manufacturing method of a nonvolatile semiconductor storage device according to an embodiment of the present invention comprises forming a first gate insulating film on a semiconductor substrate; depositing a material for floating gate electrodes on the first gate insulating film; forming a plurality of trenches which extend through the material for the floating gate electrodes and the first gate insulating film and reach the semiconductor substrate; etching side walls of the material for the floating gate electrodes to form the floating gate electrodes such that a lower hem of the material for the floating gate electrodes facing an element-forming region is narrower than a width of a surface of the element-forming region in a section taken in a direction perpendicular to a direction in which the trenches extend; forming second gate insulating films on the floating gate electrodes; and forming control gate electrodes on the second gate insulating films.

A manufacturing method of a nonvolatile semiconductor storage device according to an embodiment of the present invention comprises forming a first gate insulating film on a semiconductor substrate; depositing a material for floating gate electrodes on the first gate insulating film; forming a plurality of trenches which extend through the material for the floating gate electrodes and the first gate insulating film and which reach the semiconductor substrate, and forming an element-forming region in which a width of at least a part of a body is narrower than a width of a top surface in a section taken in a direction perpendicular to a direction in which the trenches extend; forming a second gate insulating film on the material for the floating gate electrodes; and forming a control gate electrode on the second gate insulating film.

BRIEF DESCRIPTION OF THE DRAWINGS

FIG. 18 is a sectional view showing a method of manufacturing the memory following FIG. 17;

FIGS. 19(A) and 19(B) are sectional views of a NAND-type flash memory 200 according to the third embodiment of the present invention;

FIGS. 23(A) and 23(B) are sectional views of a NAND-type flash memory 300 according to the fourth embodiment of the present invention;

DETAILED DESCRIPTION OF THE INVENTION

Embodiments according to the present invention will be explained below with reference to the drawings. These embodiments are not intended to limit the present invention. The drawings schematically show practical devices and are not made to scale.

First Embodiment

Figure 1:
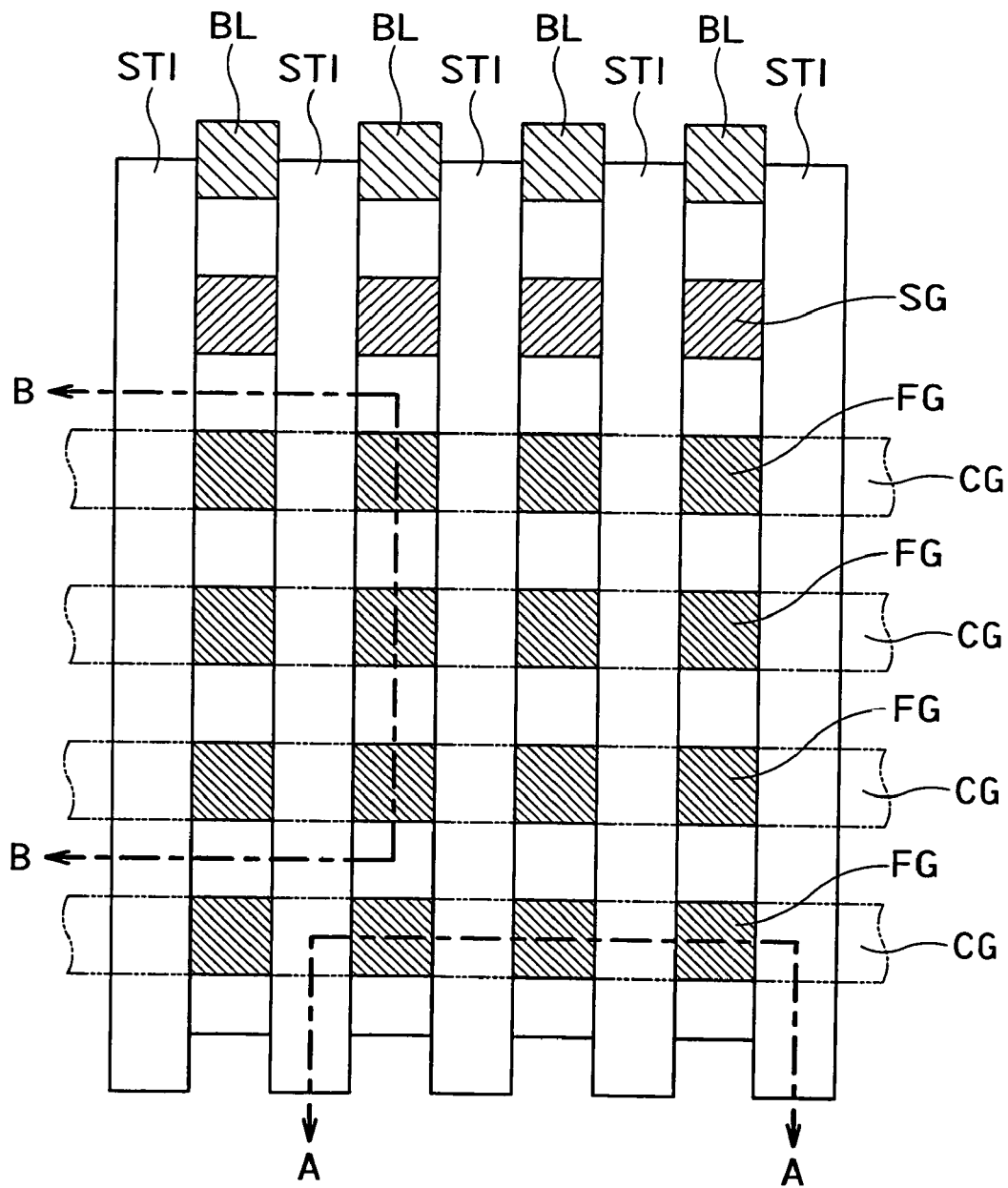
FIG. 1 is a plan view of a NAND-type flash memory 100 according to the first embodiment of the present invention.

FIG. 1 is a plan view of a NAND-type flash memory 100 (to be also simply referred to as the memory 100 hereinafter) according to the first embodiment of the present invention. The memory 100 comprises bit lines BL, selection gate electrodes SG, floating gate electrodes FG, control gate electrodes CG, and STIs (Shallow Trench Isolations) as isolation regions. Since the selection gate electrodes SG are provided, each memory cell need not be provided with one or more of the bit lines BL. Consequently, the NAND-type flash memory 100 is more favorable to miniaturization than a DRAM or NOR-type flash memory.

Generally, in a NAND-type flash memory which does not require formation of a bit-line contact for each bit, the spacing between adjacent ones of the floating gate electrodes FG decreases along with miniaturization of devices. As described above, this causes enhancement of the proximity effect.

Figure 2A:
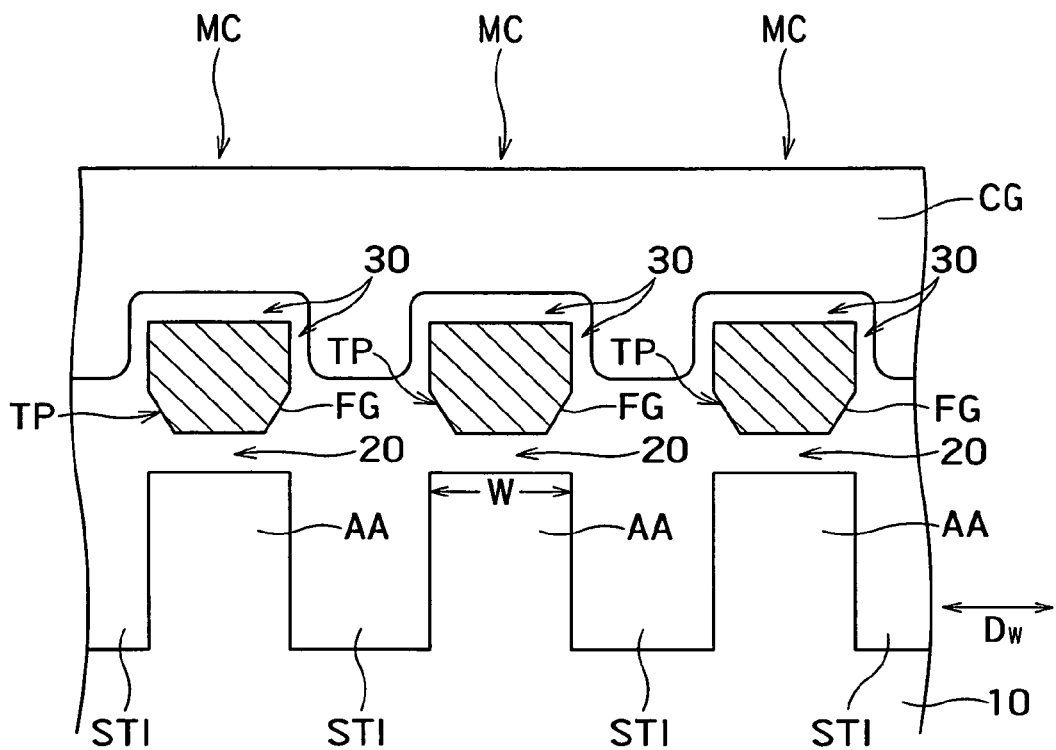
FIG. 2(A) is a sectional view taken along the line A-A shown in FIG. 1.
Figure 2B:
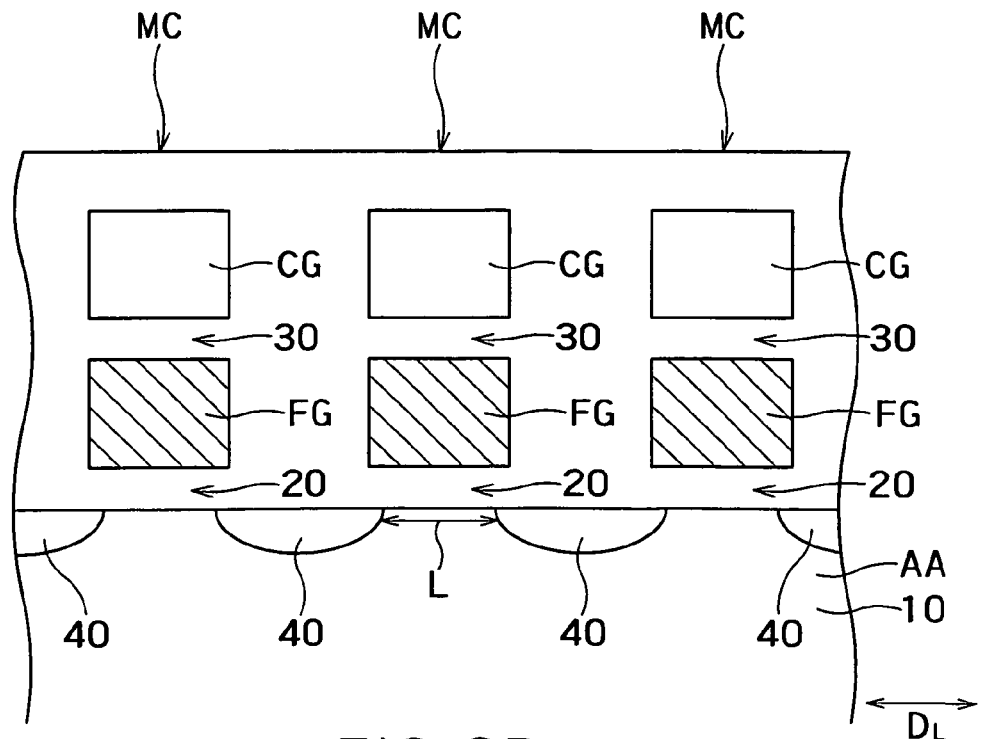
FIG. 2(B) is a sectional view taken along the line B-B shown FIG. 1.

FIG. 2(A) is a sectional view taken along the line A-A shown in FIG. 1; and FIG. 2(B) is a sectional view taken along the line B-B shown FIG. 1. The memory 100 comprises a semiconductor substrate 10, active areas AA serving as element-forming regions, first gate insulating films (tunnel insulating films) 20, the floating gate electrodes FG, second gate insulating films 30, the control gate electrodes CG, and diffusion layers 40.

As shown in FIG. 1, the plurality of STIs are formed in the semiconductor substrate 10 in stripes and act as isolation regions. Each active area AA is provided between corresponding adjacent ones of the STIs. Each first gate insulating film 20 is provided on the corresponding active area AA. Each floating gate electrode FG is provided on the corresponding first gate insulating film 20. Each second gate insulating film 30 is provided on the corresponding floating gate electrode FG. Each control gate electrode CG is provided on the corresponding second gate insulating film 30.

As shown in FIG. 2(B), each diffusion layer 40 is formed on the surface of the corresponding active area AA between corresponding adjacent ones of the floating gate electrodes FG. Let L be the channel length between adjacent ones of the diffusion layers 40. Let W be the channel width, as shown in FIG. 2(A). A channel length direction $D_L$ is a direction in which the STIs extend and in which charges flow between the diffusion layers 40. A channel width direction $D_W$ is orthogonal to the channel length direction $D_L$.

As shown in FIG. 2(A), tapers TP are formed at sides of the floating gate electrodes. For this reason, the width of the lower hem of each floating gate electrode FG facing the corresponding active area AA is narrower than that of the active area AA in a section taken along with the channel width direction $D_W$. In other words, the lower hem of each floating gate electrode FG is formed to have a width narrower than the channel width W. As a result, as will be described later, the proximity effect between memory cells can be suppressed. Each taper TP is desirably formed across each of parts of respective sides of the floating gate electrodes FG for adjacent bits, between which the corresponding control gate electrode CG is not sandwiched.

Figure 6:
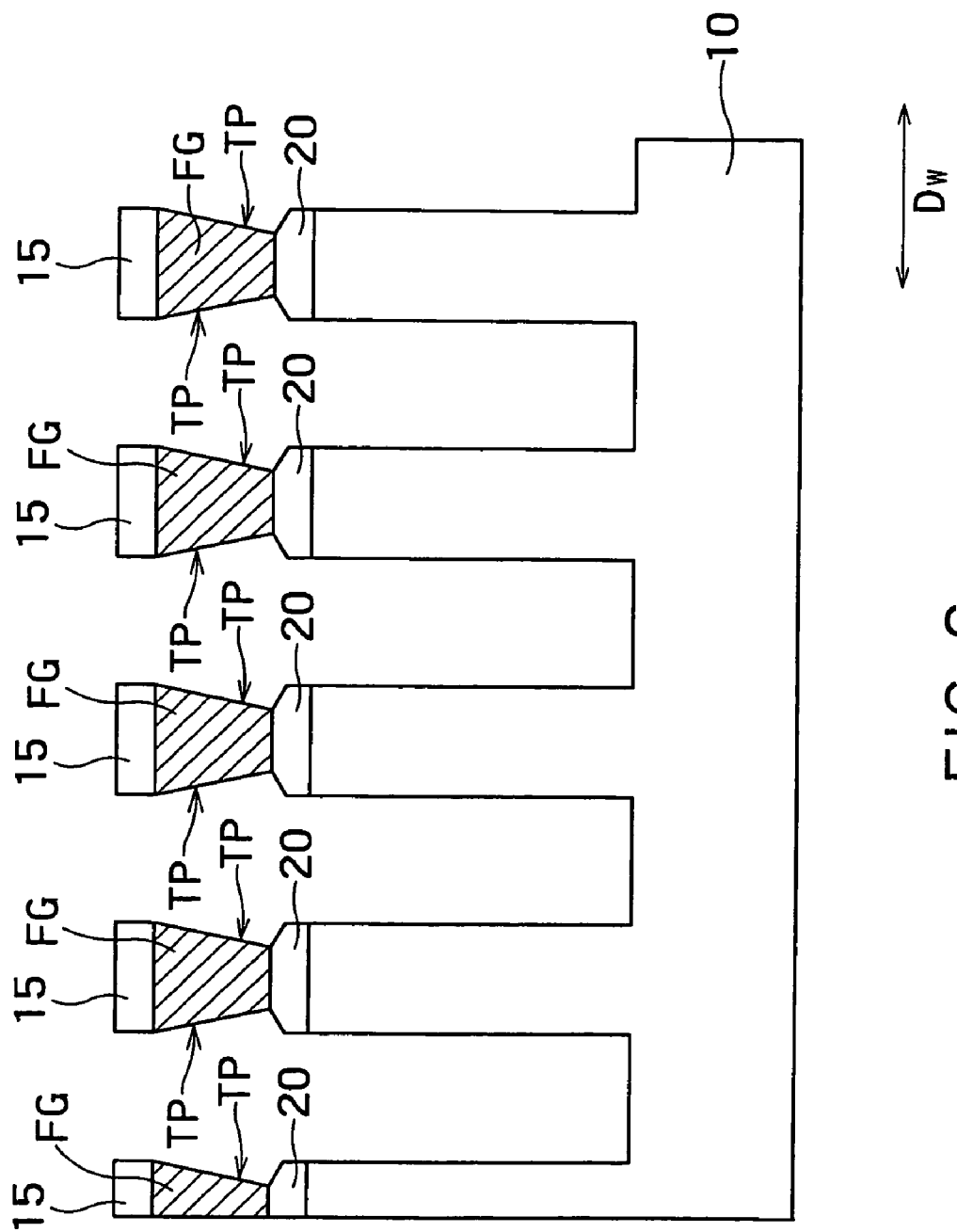
FIG. 6 is a sectional view showing a method of manufacturing the memory 100 following FIG. 5.
Figure 7:
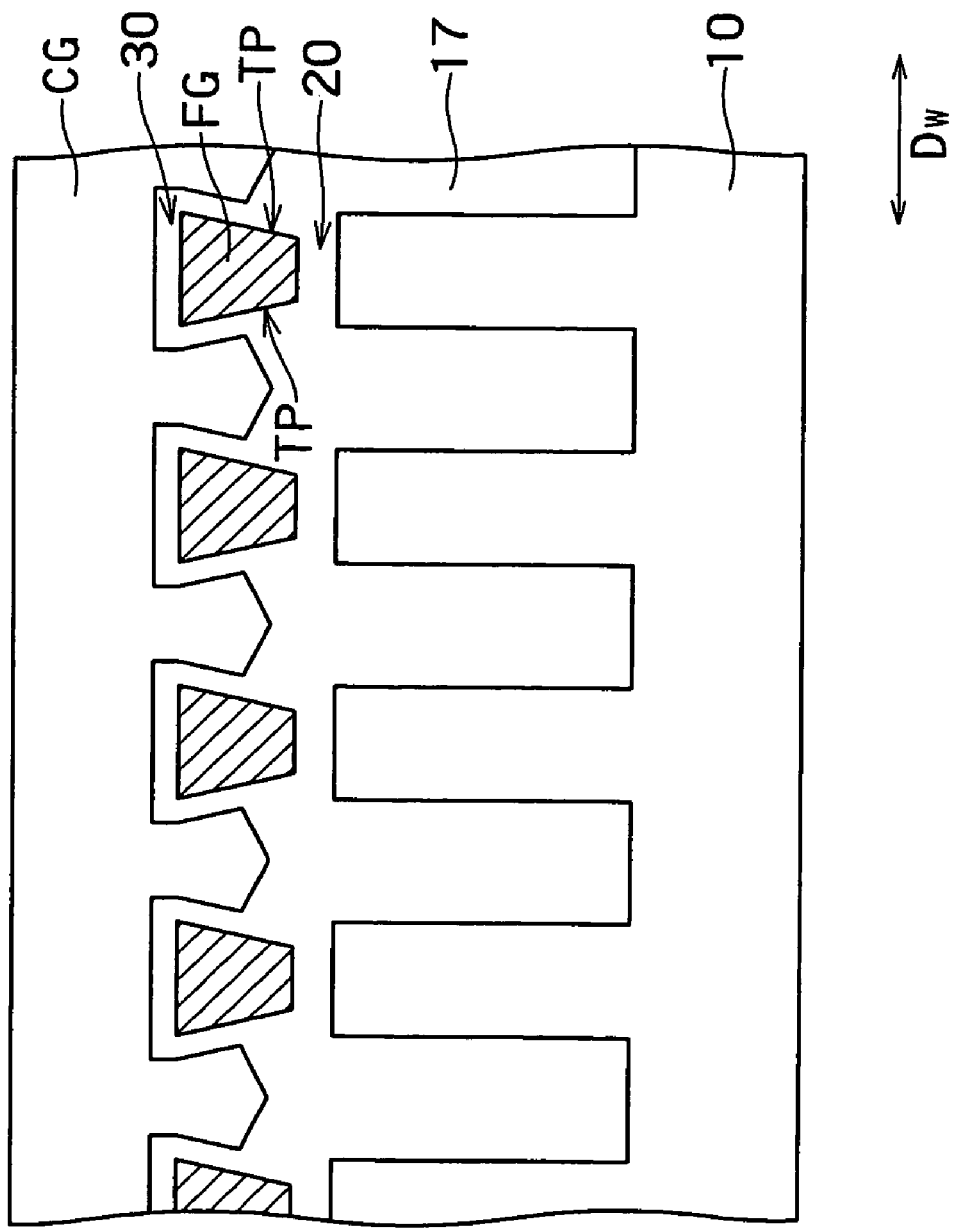
FIG. 7 is a sectional view showing a method of manufacturing the memory 100 following FIG. 6.
Figure 8A:
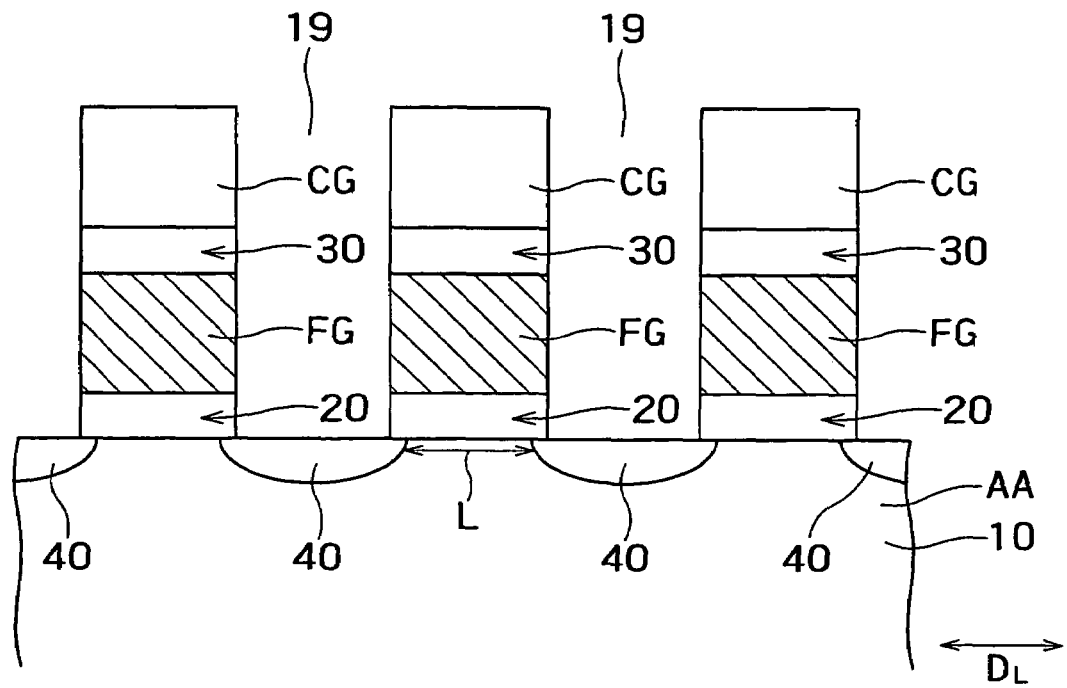
FIG. 8 is a sectional view showing a method of manufacturing the memory 100 following FIG. 7.
Figure 8B:
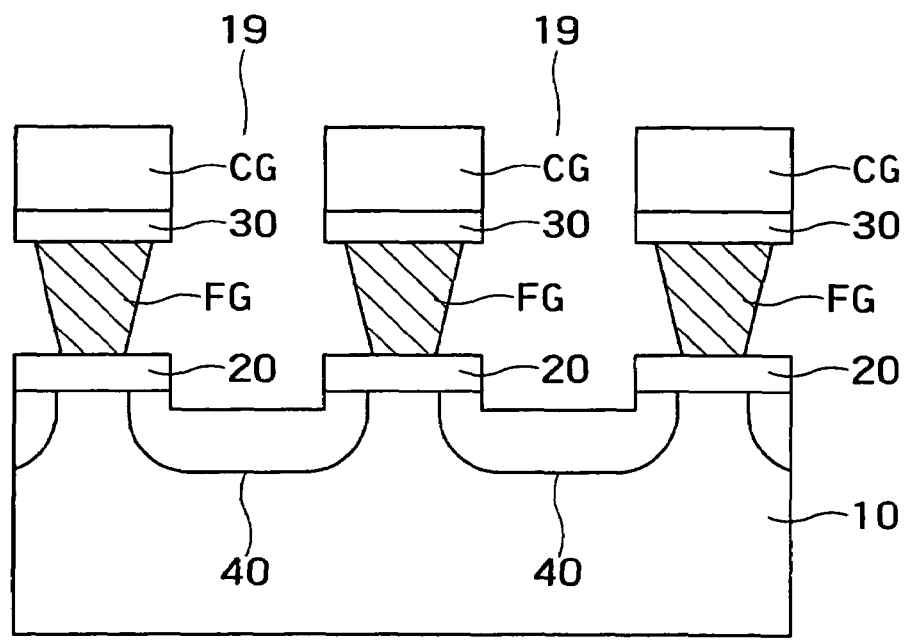

FIGS. 3 to 8(B) are sectional views showing the flow of a method of manufacturing the memory 100 according to the embodiment of present invention. FIGS. 3 to 7 show a section taken in a direction along the line A-A in FIG. 1 (channel width direction $D_W$). FIGS. 8(A) and 8(B) show a section taken in a direction along the line B-B in FIG. 1 (channel length direction $D_L$). Note that although each taper TP is provided across a side wall (from the top surface to the bottom surface) of the corresponding floating gate electrode in this manufacturing method, effects obtained by the method are the same as those obtained by the memory (see FIG. 2(A)) in which the tapers TP are provided only at the lower portions of the floating gate electrodes.

Figure 3:
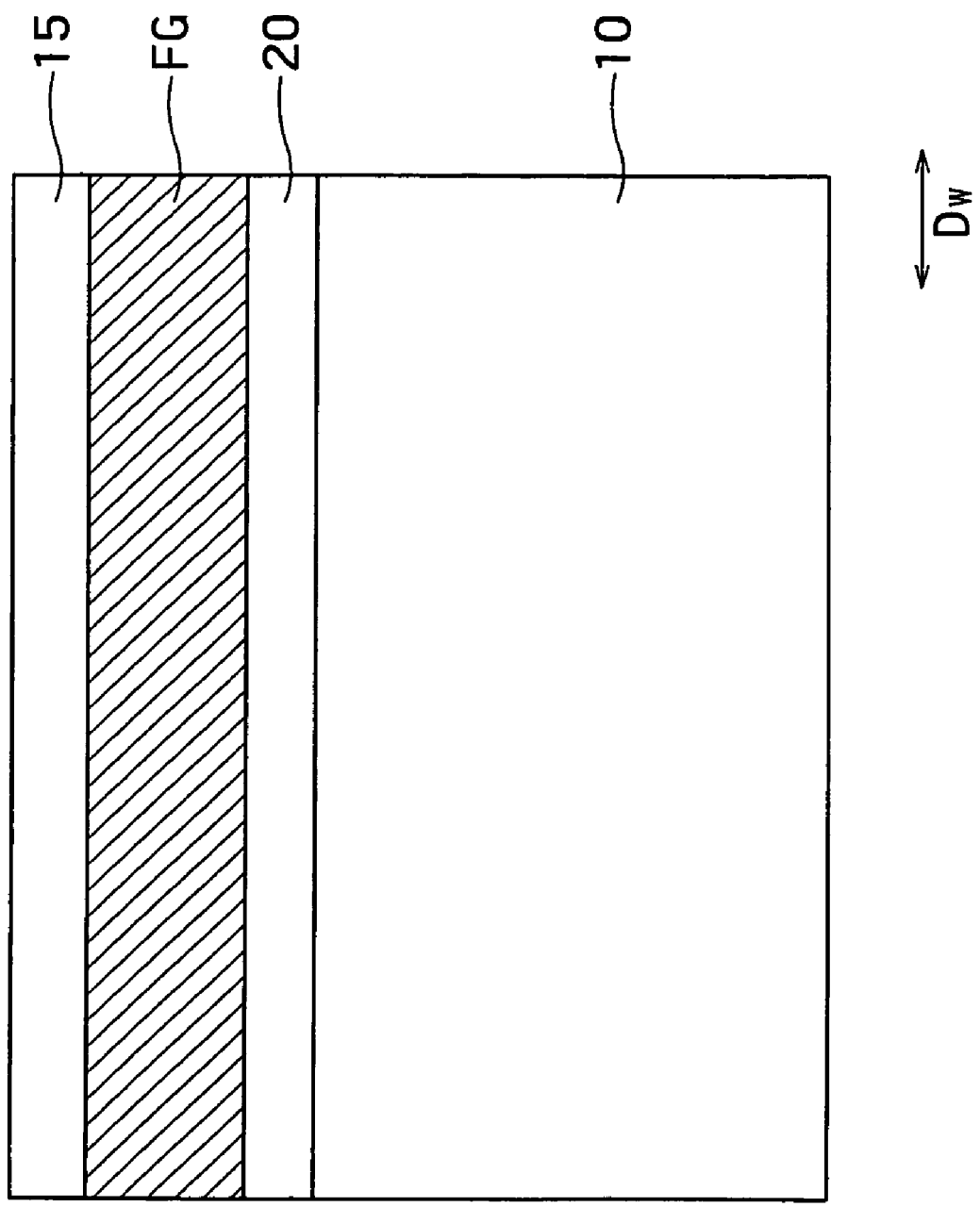
FIG. 3 is a sectional view showing a method of manufacturing the memory 100.
Figure 4:
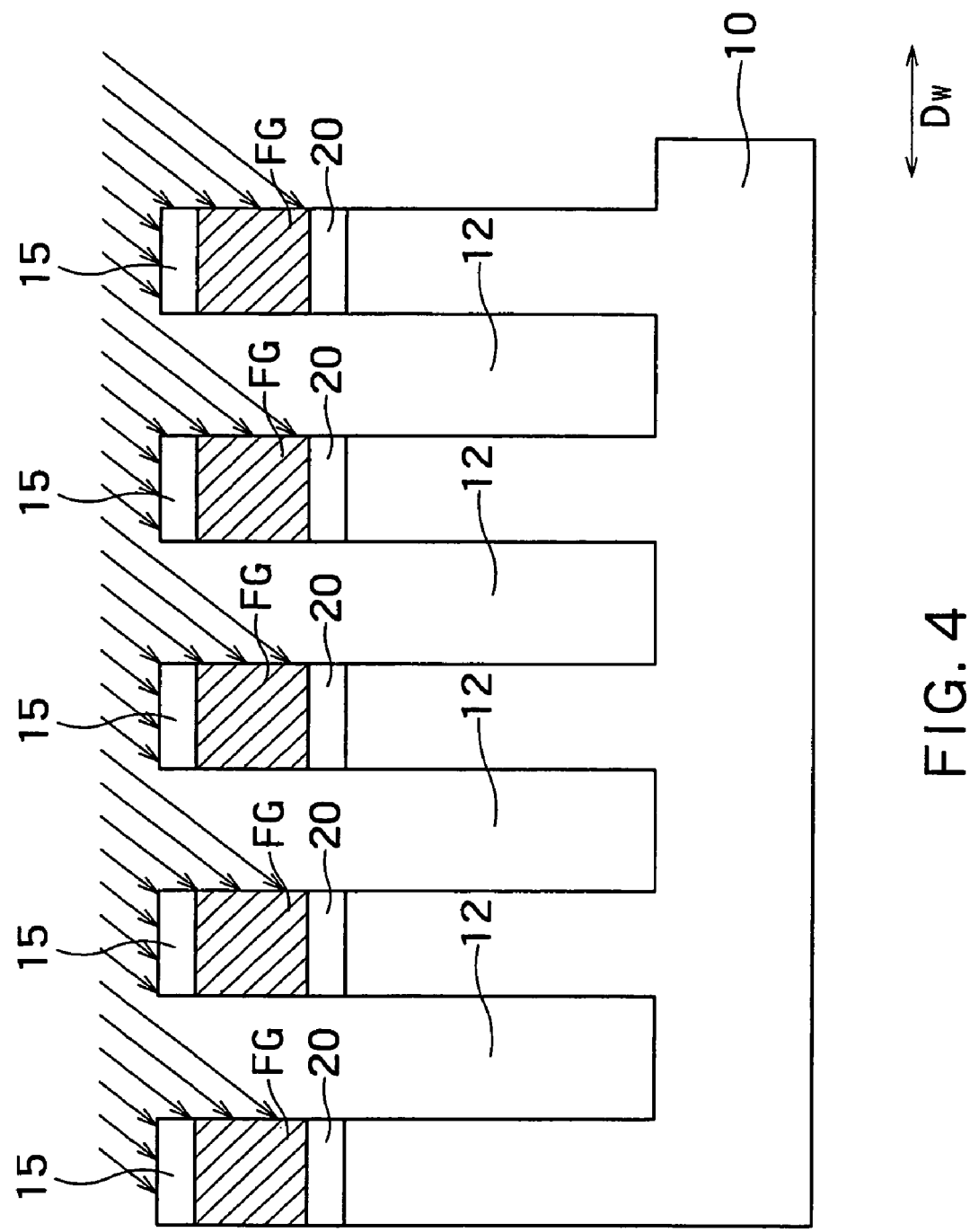
FIG. 4 is a sectional view showing a method of manufacturing the memory 100 following FIG. 3.

First, as shown in FIG. 3, a material for the first gate insulating films 20, a material for the floating gate electrodes FG, and a mask material 15 are formed in this order on the semiconductor substrate 10. The material for the first gate insulating films 20 is formed by, e.g., directly oxidizing the semiconductor substrate 10 or depositing SiO$_2$ thereon. The floating gate electrode material (FG) and mask material 15 are formed by, e.g., CVD (Chemical Vapor Deposition). After gate patterning, trenches 12 shown in FIG. 4 are formed. Each trench 12 is so formed as to extend through the material for the floating gate electrodes FG and that for the first gate insulating films 20 and reach the semiconductor substrate 10. This causes side walls of the floating gate electrodes FG to appear inside the trenches 12. The trenches 12 are formed by, e.g., RIE using the mask material 15 as a mask.

Figure 5:
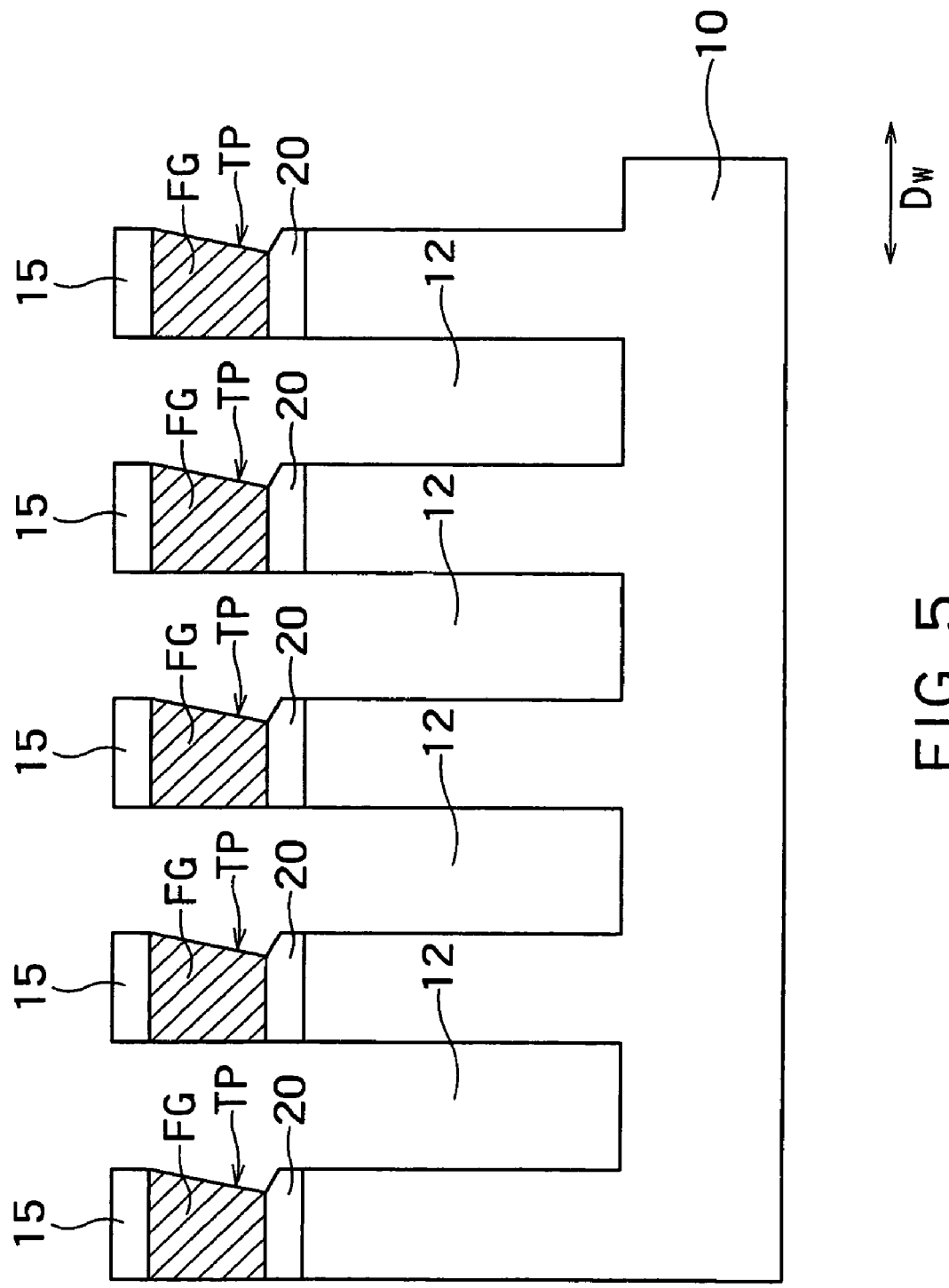
FIG. 5 is a sectional view showing a method of manufacturing the memory 100 following FIG. 4.

Then, one of two side walls of each floating gate electrode FG is anisotropically etched in an inclined direction with respect to the side wall. More specifically, the side wall is etched in a direction inclined, toward the channel width direction $D_W$, from a direction heading from above the semiconductor substrate 10 toward the surface of the semiconductor substrate 10. This etching will also be referred to as "oblique etching" hereinafter. Oblique etching may be implemented using, e.g., RIE. With this operation, each taper TP is formed at one of two side walls of the corresponding floating gate electrode FG, as shown in FIG. 5.

Similarly, the other of the two side walls of the floating gate electrode FG is anisotropically etched in a direction inclined with respect to the other side wall. With this operation, the tapers TP are formed at the two side walls of the floating gate electrodes FG, as shown in FIG. 6.

Then, as shown in FIG. 7, an insulator 17 is deposited in the trenches 12. The insulator 17 is made of, e.g., a silicon dioxide film like the first gate insulating films 20. At this time, the insulator 17 is deposited to the top surfaces of the floating gate electrodes FG and then is etched back halfway along side walls of the floating gate electrodes FG. The mask material 15 shown in FIG. 6 is also removed by the etch-back.

The second gate insulating films 30 are formed on the floating gate electrodes FG. Then, a material for the control gate electrodes CG is deposited on the second gate insulating films 30. Since the insulator 17 has been etched back halfway along the side walls of the floating gate electrodes FG, the material for the control gate electrodes CG enters, in a self-aligned manner, between side walls of adjacent ones of the floating gate electrodes FG.

As shown in FIG. 8(A), the control gate electrodes CG and floating gate electrodes FG are etched using photolithography and RIE. Note that FIG. 8(A) shows a section of the device taken in the channel length direction $D_L$. In this step, the floating gate electrodes FG are separated from each other such that each of memory cells MC is provided with one of the floating gate electrodes FG. Then, impurities are ion-implanted into the active areas AA, and annealing is performed, thereby forming the diffusion layers 40. A protective film 19 is further deposited. After that, contacts, wiring, and the like are formed using a known method, and the memory 100 is completed.

Figure 9:
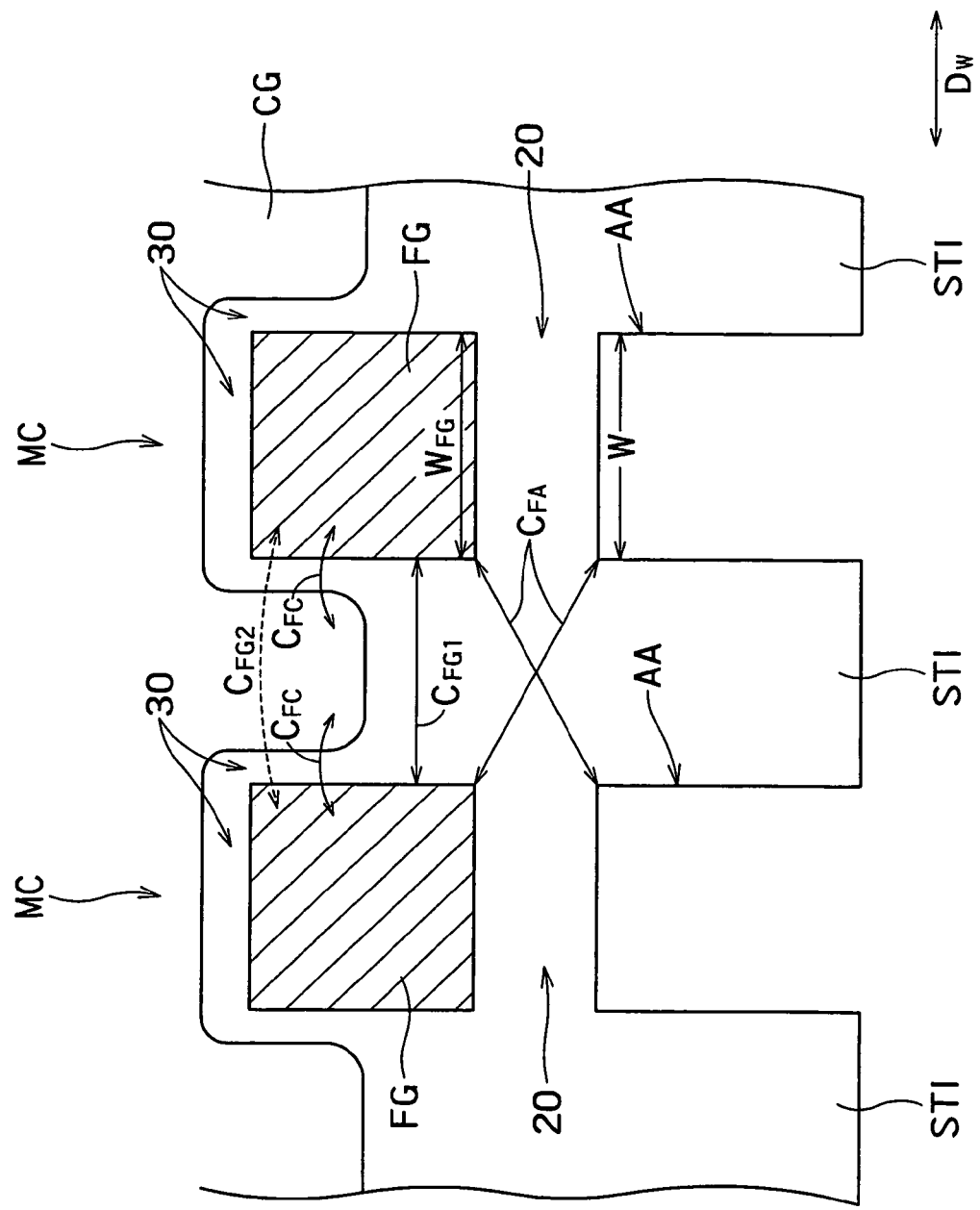
FIG. 9 is a sectional view of a conventional NAND-type flash memory in the channel width direction.
Figure 10:
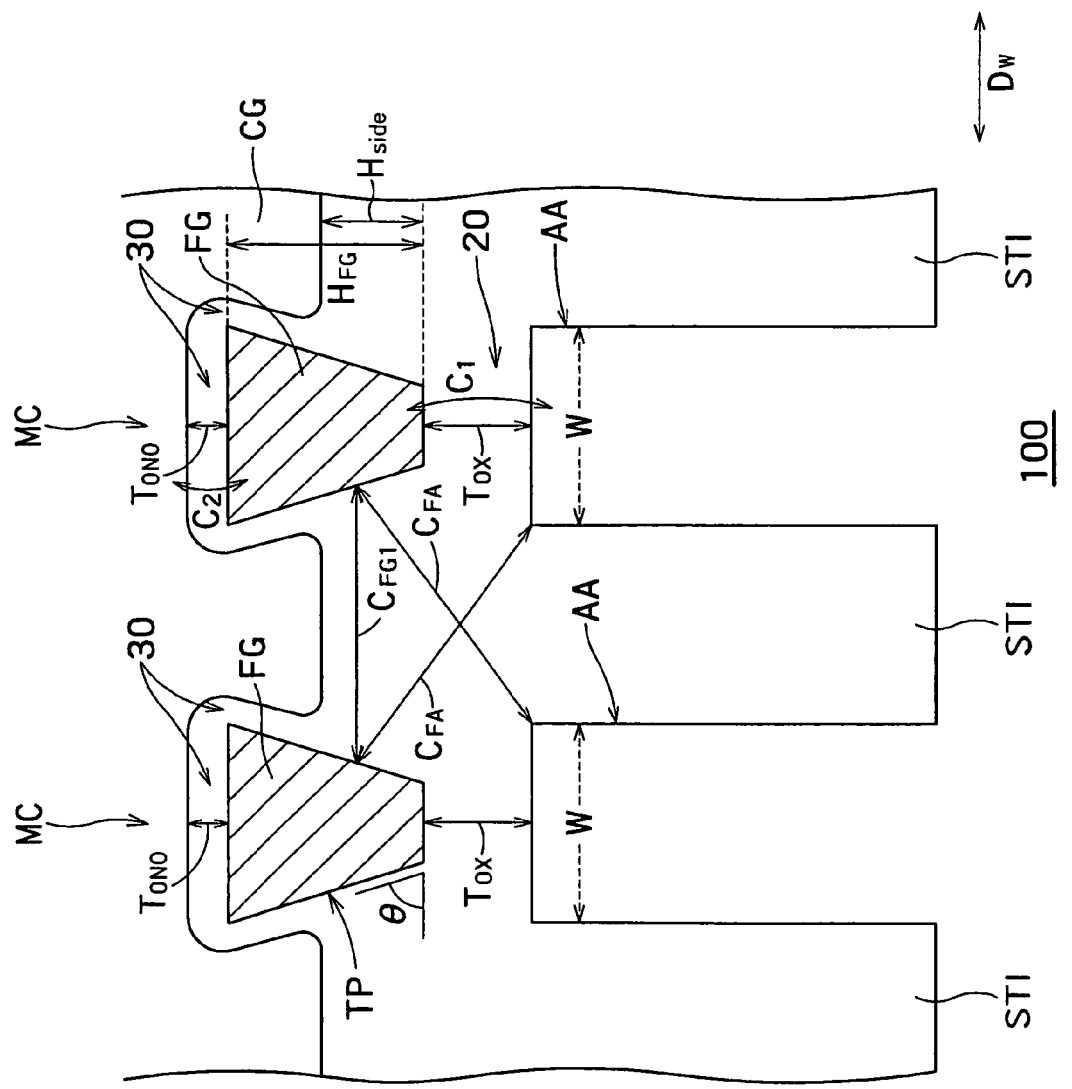
FIG. 10 is a sectional view of the NAND-type flash memory 100 according to the first embodiment in the channel width direction DW.

FIG. 9 is a sectional view of a conventional NAND-type flash memory in the channel width direction; and FIG. 10 is a sectional view of the NAND-type flash memory 100 according to the first embodiment in the channel width direction $D_W$. FIGS. 9 and 10 are exaggerated for ease of understanding.

Referring to FIG. 10, a condition to be met by the shape of a section of each floating gate electrode FG taken in the channel width direction $D_W$ will be explained. The sectional shape of the floating gate electrode FG preferably satisfies Formula 1:

$$\frac{\gamma}{W} \cdot \frac{H_{FG} - H_{side}}{1 - \frac{\alpha}{\beta} \cdot \frac{T_{OX}}{T_{ONO}}} < \tan\theta < \frac{\gamma}{W} \cdot \frac{H_{FG} - H_{side}}{1 - \frac{\beta}{\alpha} \cdot \frac{T_{OX}}{T_{ONO}}} \quad \text{[Formula 1]}$$

where $H_{FG}$ represents the height (thickness) of each floating gate electrode FG; and $H_{side}$, the thickness of a portion, of a side wall of the floating gate electrode FG, at which the corresponding taper TP is not formed. In the memory 100 shown in FIG. 10, $H_{side}$ is zero. However, even when $H_{side}$ is more than zero like the floating gate electrodes FG shown in FIG. 2(A), this embodiment does not lose its effects. In Formula 1, $\theta$ represents an angle which each taper TP forms with respect to the surface of the corresponding active area AA; $T_{OX}$, the thickness of the first gate insulating films; $T_{ONO}$, the thickness of the second gate insulating films 30; and W, a gate width. Also, $\alpha$ represents the lower limit of a capacitive coupling ratio ($C_r = C_2/(C_1+C_2)$, where $C_1$ and $C_2$ respectively represent the capacitances of the first and second gate insulating films) to be controlled; and $\beta$, the upper limit of the capacitive coupling ratio to be controlled. If two side walls of each floating gate electrode FG each have the corresponding taper TP, $\gamma$ is 2. On the other hand, if only one of the two side walls of the floating gate electrode FG has the corresponding taper TP, as in a modification (to be described later), $\gamma$ is 1.

Effects of the first embodiment will be explained with reference to FIGS. 9 and 10. As described above, the proximity effect such as interference between memory cells is produced by capacitive coupling between memory cells. A capacitance is inversely proportional to the spacing between two conductors facing each other across an insulator and is proportional to the facing area of the conductors. The width of an STI narrows along with miniaturization of devices. Accordingly, a capacitance which constitutes a main factor in the proximity effect due to miniaturization of devices is a capacitance $C_{FG1}$ between the lower portions of adjacent ones of the floating gate electrodes FG.

Since the corresponding control gate electrode CG intervenes between the upper portions of the adjacent floating gate electrodes FG, a capacitance $C_{FG2}$ does not influence the proximity effect.

Miniaturization also narrows the distance between each floating gate electrode FG and the active area AA of the corresponding memory cell MC adjacent to the floating gate electrode FG. Thus, a capacitance $C_{FA}$ between each floating gate electrode FG of the corresponding memory cell MC and the active area AA of the memory cell MC adjacent to the floating gate electrode FG is also a capacitance which can cause the proximity effect. Note that since the distance between each floating gate electrode FG and the active area AA of the corresponding memory cell MC adjacent to the floating gate electrode is larger than that between adjacent ones of the floating gate electrodes FG, the capacitance $C_{FA}$ causes the proximity effect secondary to that by the capacitance $C_{FG1}$.

The conventional memory shown in FIG. 9 will be compared with the memory 100 according to this embodiment shown in FIG. 10. In this embodiment, each taper TP is formed at one of two side walls of the corresponding floating gate electrode FG. For this reason, the width of the lower hem of each floating gate electrode FG is narrower than that of the corresponding active area AA in the channel width direction $D_W$. Accordingly, the distance between adjacent ones of the floating gate electrodes FG becomes wider than in the conventional memory, thus resulting in a decrease in the capacitance $C_{FG1}$. The distance between the floating gate electrode FG of one of the memory cells MC and the active area AA of the memory cell MC adjacent to the floating gate electrode FG also becomes wider at the lower portion of the floating gate electrode FG than that of the conventional memory. Consequently, the capacitance $C_{FA}$ decreases. Therefore, the proximity effect between adjacent ones of the memory cells MC is suppressed.

Since the proximity effect between adjacent ones of the memory cells MC is suppressed, the capacitive coupling ratio in one of the memory cells MC can be controlled easily. For example, letting $C_1$ be the capacitance between each floating gate electrode FG and the corresponding active area AA, and $C_2$, the capacitance between the floating gate electrode FG and the corresponding control gate electrode CG, a capacitive coupling ratio $C_r$ can be represented by $C_2/(C_1+C_2)$. The capacitive coupling ratio $C_r$ is an important parameter which pertains to write/read of data to/from the memory cells MC, and $C_1$ and $C_2$ must be larger than the capacitance $C_{FG1}$ which is a main factor in the proximity effect. According to this embodiment, since the capacitance $C_{FG1}$ decreases, the ranges which the capacitances $C_1$ and $C_2$ can cover widen. As a result, it becomes easy to control the capacitive coupling ratio $C_r$. Since the facing area of each floating gate electrode FG and the corresponding active area AA decreases, the capacitance $C_1$ becomes smaller than $C_2$. This brings about the effect of increasing the capacitive coupling ratio $C_r$.

First Modification of First Embodiment

In the first embodiment, two side walls of each floating gate electrode FG are etched in a direction inclined toward the channel width direction $D_W$, and the tapers TP are formed at the two side walls of the floating gate electrode FG. Instead of or in addition to this, in the manufacturing step shown in FIG. 8(A), the remaining two side walls of the floating gate electrode FG may be etched in a direction inclined toward the channel length direction $D_L$. With this operation, the corresponding tapers TP are formed at the remaining two side walls of the floating gate electrode FG in a section taken in the channel length direction $D_L$. More specifically, as shown in FIG. 8(B), the width of the lower hem of each floating gate electrode FG becomes narrower than the channel length L in a section taken in the channel length direction $D_L$.

According to this modification, the effects of the first embodiment become more prominent. Also, the facing area of each floating gate electrode FG and one of the corresponding diffusion layers 40 decreases. This causes a decrease in the capacitance (to be referred to as an overlap capacitance hereinafter) between the floating gate electrode FG and the diffusion layer 40. As a result, interference can be prevented between adjacent ones of the memory cells MC through the corresponding diffusion layer 40. Note that in forming the tapers TP at the four side walls of the floating gate electrodes FG, oblique etching needs be performed four times to form each floating gate electrode FG.

Second Modification of First Embodiment

Figure 11:
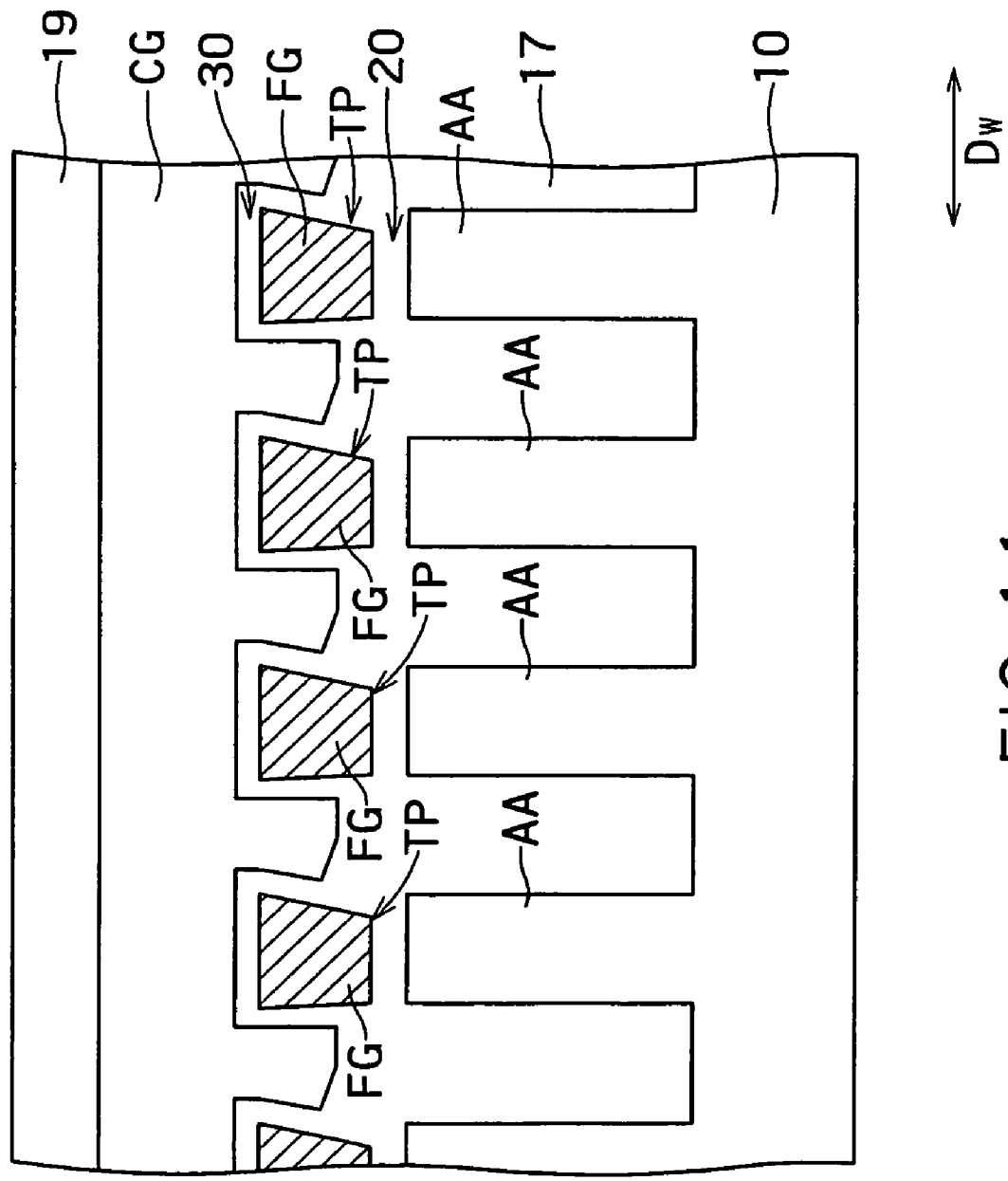
FIG. 11 is a sectional view showing the second modification of the first embodiment according to the present invention.

FIG. 11 is a sectional view showing the second modification of the first embodiment according to the present invention. In this modification, only one of two side walls of each floating gate electrode FG is etched by oblique etching. As described above, even if each taper TP is formed only at one of two side walls of the corresponding floating gate electrode FG, the width of the lower hem of the floating gate electrode FG becomes narrower than the width of the corresponding active area AA. Accordingly, the same effects as in the first embodiment can be obtained. According to this modification, it is only necessary to etch one of two side walls of each floating gate electrode FG by RIE. Thus, the manufacturing cost can be suppressed.

Second Embodiment

Figure 12:
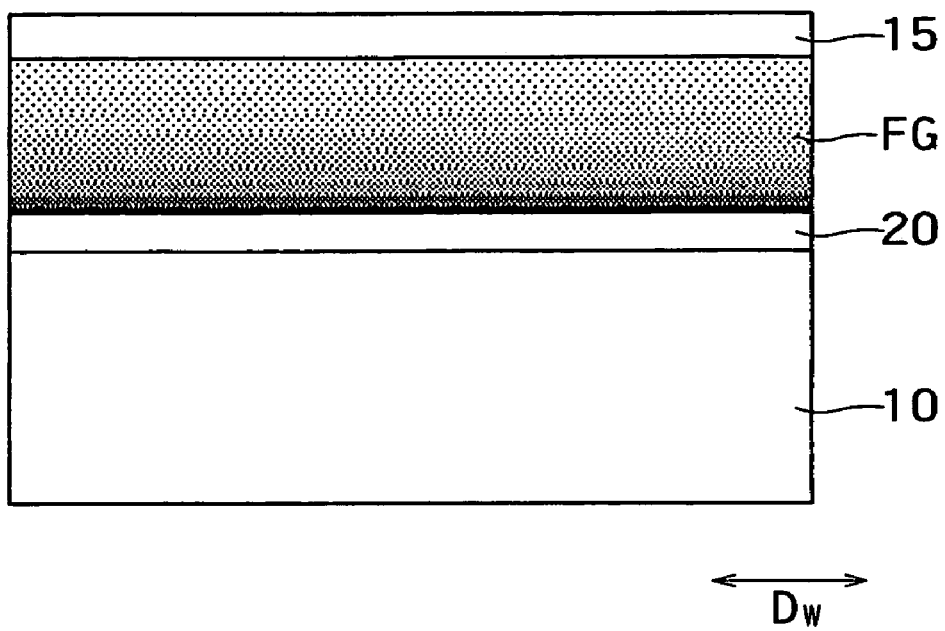
FIG. 12 is a sectional view showing a method of manufacturing a NAND-type flash memory according to the second embodiment of the present invention.
Figure 13:
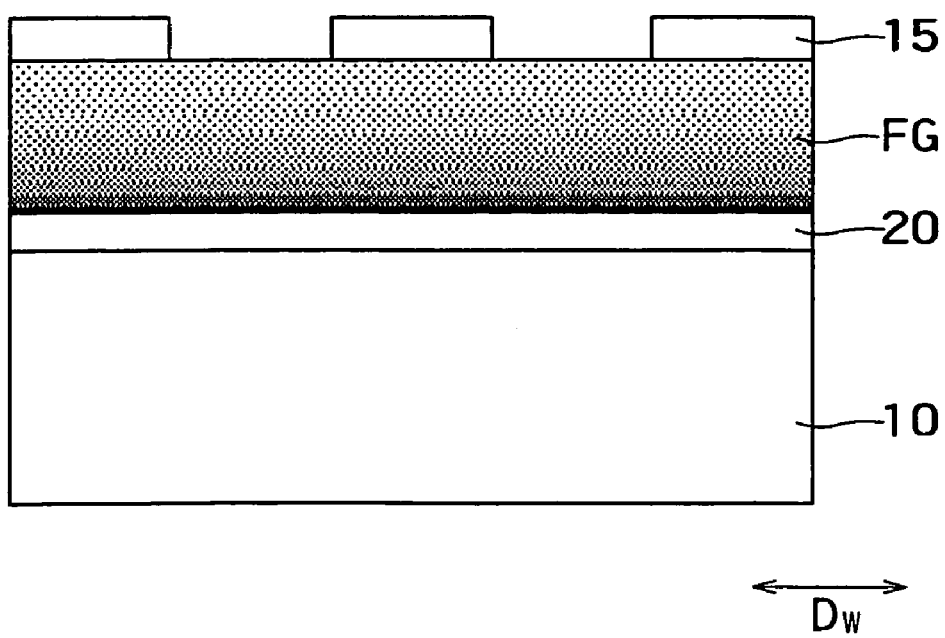
FIG. 13 is a sectional view showing a method of manufacturing the memory following FIG. 12.
Figure 14:
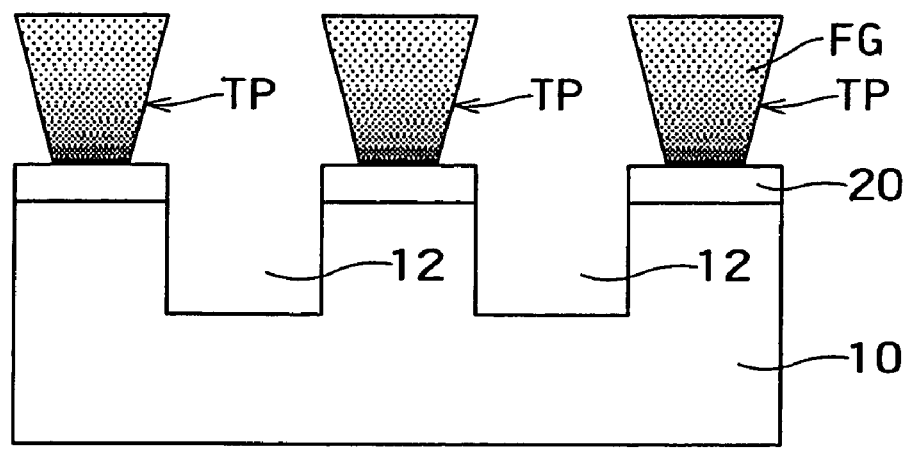
FIG. 14 is a sectional view showing a method of manufacturing the memory following FIG. 13.

FIGS. 12 to 14 are sectional views showing the flow of a method of manufacturing a NAND-type flash memory 100 according to the second embodiment of the present invention. FIGS. 12 to 14 show a section taken in a channel width direction $D_W$. The manufacturing method according to the second embodiment can manufacture the memory 100.

First, as shown in FIG. 12, a material for first gate insulating films 20, a material for floating gate electrodes FG, and a mask material 15 are deposited in this order on a semiconductor substrate 10. In depositing the material for the floating gate electrodes FG, such as polysilicon, germanium is mixed into a gas used in the deposition step. At this time, the mixed amount of germanium is relatively large at the beginning of the deposition step and gradually decreases. With this operation, the concentration of germanium increases from the top surface of the material for the floating gate electrodes FG to the bottom surface thereof.

Next, as shown in FIG. 13, gate patterning is performed for the mask material 15, thereby removing portions within regions in which STIs are to be formed. Then, trenches 12 are formed by RIE using the mask material 15 as a mask. At this time, since the reactivity of germanium to an etching gas is higher than silicon, two side walls of each floating gate electrode FG are selectively etched on the basis of the concentration of germanium. Generally, in RIE using a chlorine-based gas, the etching rate increases with the increasing of germanium concentration. Accordingly, the floating gate electrodes FG each having the corresponding tapers TP at its two side walls are formed as shown in FIG. 14. Then, after the steps in the first embodiment described with reference to FIGS. 7 and 8(A), the memory 100 is completed.

According to the second embodiment, simultaneously with the formation of the trenches 12, two side walls of each floating gate electrode FG are etched on the basis of the concentration of germanium. Accordingly, each taper TP can be formed in a self-aligned manner at each of two side walls of the corresponding floating gate electrode FG without any additional etching step for forming the taper TP in the floating gate electrode FG. In addition, the second embodiment has the same effects as in the first embodiment.

In the second embodiment, each taper TP is formed across a side wall (from the top surface to the bottom surface) of the corresponding floating gate electrode FG. However, with the second embodiment, the tapers TP can be formed only at the lower portions of the floating gate electrodes, as shown in FIG. 2(A). In this case, it is advisable to decrease the mixed amount of germanium to zero halfway through the deposition of the material for the floating gate electrodes FG. With this operation, the concentration of germanium becomes zero at the upper portion of each floating gate electrode FG. As a result, in the step of forming the trenches 12, each taper TP is formed only at the lower portion of side walls of the corresponding floating gate electrode.

Modification of Second Embodiment

The second embodiment has been explained as a method of forming each taper TP at two side walls of the corresponding floating gate electrode FG in a section taken in the channel width direction $D_W$. However, if etching in a direction $D_L$ is performed by RIE using the same reactive gas, similar tapers are automatically formed in a section taken in the direction $D_L$ as well. If the etching in the direction $D_L$ is performed by RIE using a reactive gas with a low reactivity to Ge, no tapers are formed in a section taken in the direction $D_L$. As described above, in the second embodiment as well, a direction in which tapers are formed can be selected. The second embodiment is also advantageous in terms of manufacture in that there is no difference in the number of steps required for RIE between a case wherein tapers are formed in both sections taken in the directions $D_L$ and $D_W$ and a case wherein tapers are formed in either one of sections taken in the directions $D_L$ and $D_W$.

Figure 15:
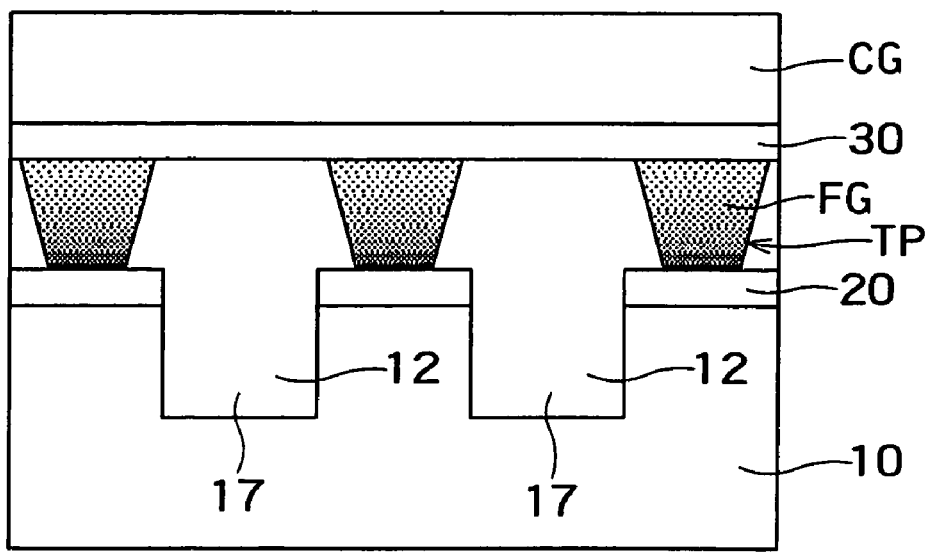
FIG. 15 is a sectional view showing a modification of the second embodiment according to the present invention.

FIGS. 15 to FIG. 18(B) are sectional views showing the flow of a method of forming tapers in both sections taken in the directions $D_L$ and $D_W$. Note that FIGS. 16(A), 17(A), and 18(A) show a section taken in the channel width direction $D_W$, and FIGS. 16(B), 17(B), and 18(B), a section taken in the channel length direction $D_L$. After the step shown in FIG. 14, the trenches 12 are filled with an insulator 17, as shown in FIG. 15. After planarization of the insulator 17, a material for second gate insulating films 30 is formed on the material for the floating gate electrodes FG. A material for the control gate electrodes CG is deposited on the material for the second gate insulating films 30.

Figure 16A:
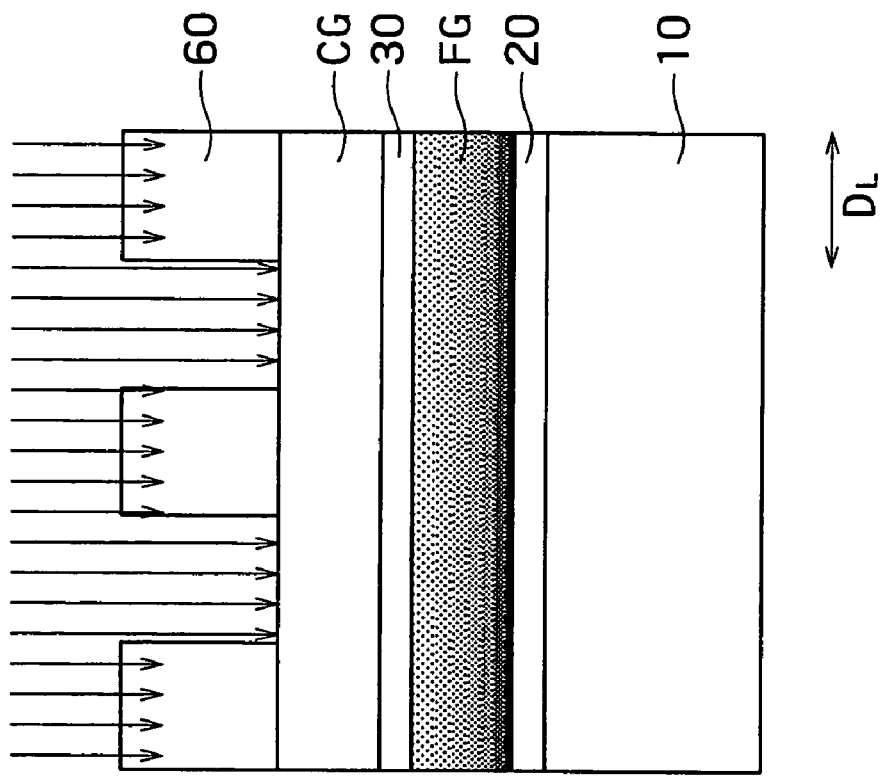
FIG. 16 is a sectional view showing a method of manufacturing the memory following FIG. 15.
Figure 16B:
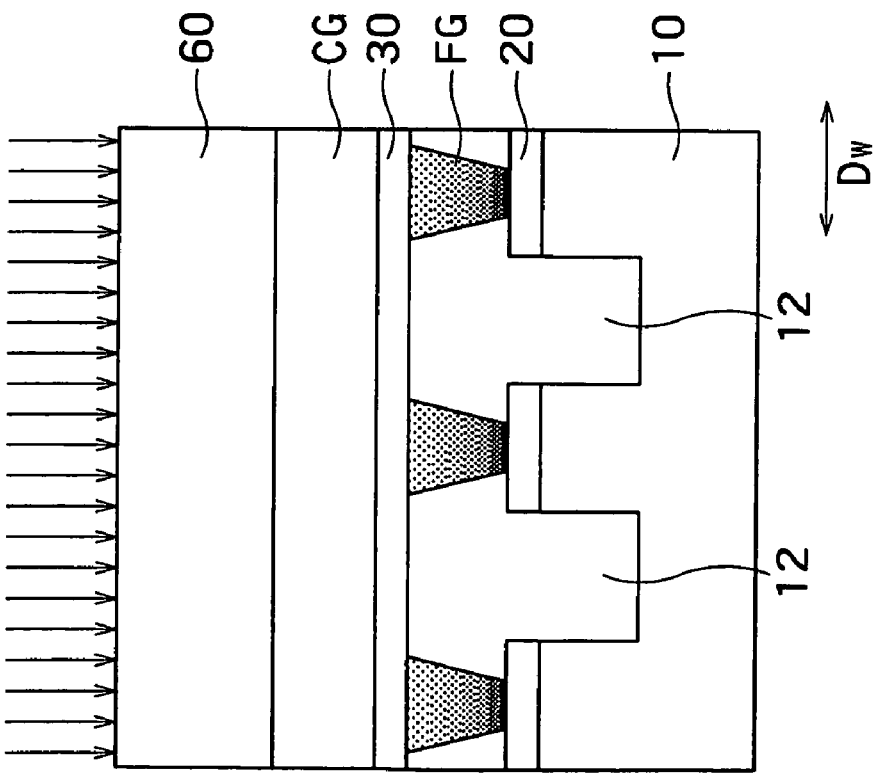

As shown in FIGS. 16(A) and 16(B), a mask material 60 is formed on the material for the control gate electrodes CG. After patterning the mask material 60, the material for the control gate electrodes CG, that for the second gate insulating films 30, that for the floating gate electrodes FG, and that for the first gate insulating films 20 are etched by RIE using the mask material 60 as a mask.

Figure 17B:
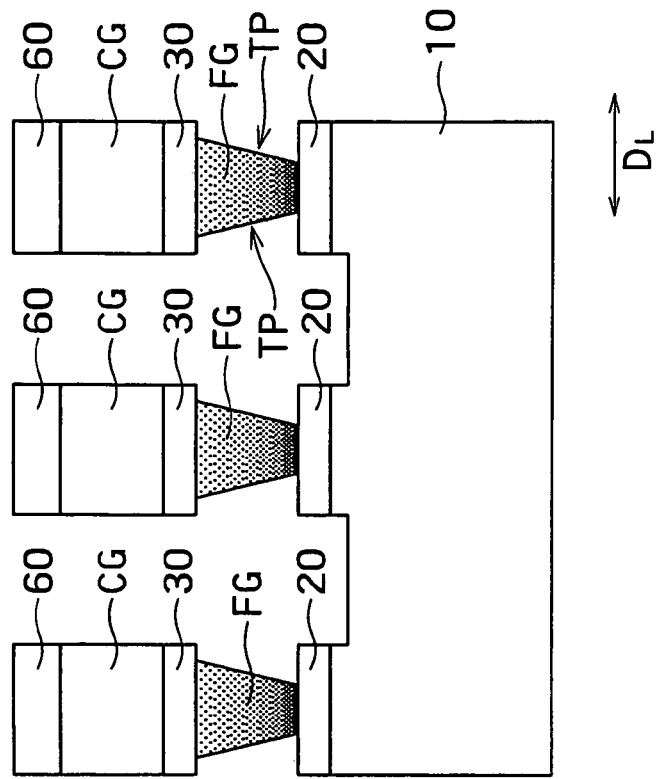
FIG. 17 is a sectional view showing a method of manufacturing the memory following FIG. 16.
Figure 17A:
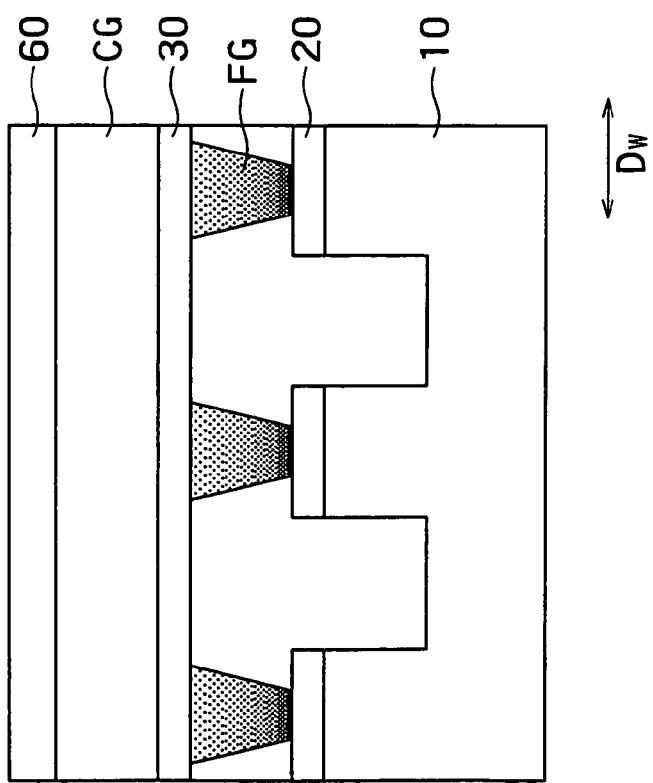

With this etching, the control gate electrodes CG which extend in the channel width direction are formed, as shown in FIGS. 17(A) and 17(B). The floating gate electrodes FG are separated from each other such that each of memory cells is provided with one of the floating gate electrodes FG. In the etching step, since the concentration of germanium is high at the lower portions of the floating gate electrodes FG, each taper TP is formed at the remaining side walls of the corresponding floating gate electrode FG in a section taken in the channel length direction $D_L$. As a result, the tapers TP are formed at the four side walls of the floating gate electrodes FG.

As shown in FIGS. 18(A) and 18(B), impurities ions are implanted into active areas AA between the floating gate electrodes FG, and annealing is performed, thereby forming diffusion layers 40. Then, the mask material 60 is removed. After that, contacts, and the like are formed using a known method, and the memory 100 is completed.

According to this modification, the same effects as in the first modification of the first embodiment are obtained. According to this modification, side walls of the floating gate electrodes FG are etched on the basis of the concentration of germanium, simultaneously with the etching of the material for the control gate electrodes CG. Accordingly, the tapers TP can be formed in a self-aligned manner at the side walls of the floating gate electrodes FG without any additional etching step for forming the tapers TP in the floating gate electrodes FG. In the manufacturing step of the floating gate electrodes FG where the tapers TP are artificially formed as described above, similar processes can be set up with a combination of a reactive gas and the first element other than Ge, wherein the first element has a reactive rate ratio different from that of Si. Also, Si can be replaced with the second element. A reactive gas can be selected depending on the first and second elements.

Third Embodiment

FIGS. 19(A) and 19(B) are sectional views of a NAND-type flash memory 200 (to be also simply referred to as the memory 200 hereinafter) according to the third embodiment of the present invention. FIG. 19(A) is a sectional view taken along the line A-A shown in FIG. 1; and FIG. 19(B) is a sectional view taken along the line B-B shown in FIG. 1. In the third embodiment, recesses C are formed in side walls of active areas AA in a section taken in a channel width direction $D_W$, as shown in FIG. 19(A). With these recesses C, the width of at least a part of the sides (body) of each active area AA is narrower than that of the top surface of the active area AA, in a section taken in a direction perpendicular to a direction in which STIs extend. Each recess C is formed at a depth equal to that where an off-leak current flows in the active area AA. More specifically, the depth is ideally equal to or deeper than that where an extension of a diffusion layer is located. Accordingly, an off-leak current can be reduced, as will be described later. The content of germanium in each active area AA is the highest at a depth where corresponding ones of the recesses C are formed. As described above, Ge as well as a reactive gas can be replaced with another element to adjust the reaction rate ratio. This makes it possible to easily form the recesses C. Other components of the third embodiment may be the same as those in the first and second embodiments.

Figure 20:
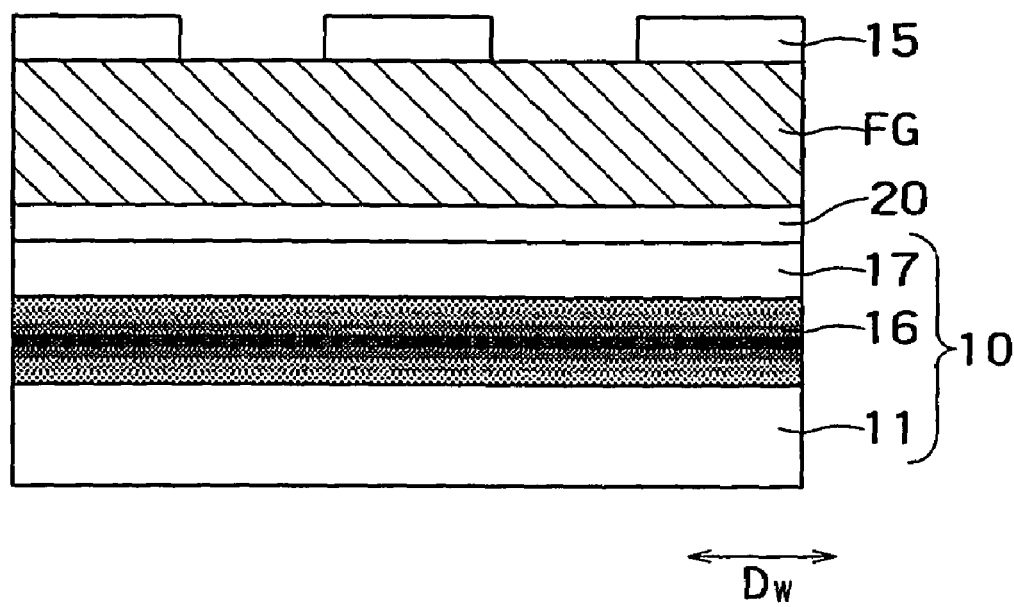
FIG. 20 is a sectional view showing a method of manufacturing the memory 200.
Figure 21:
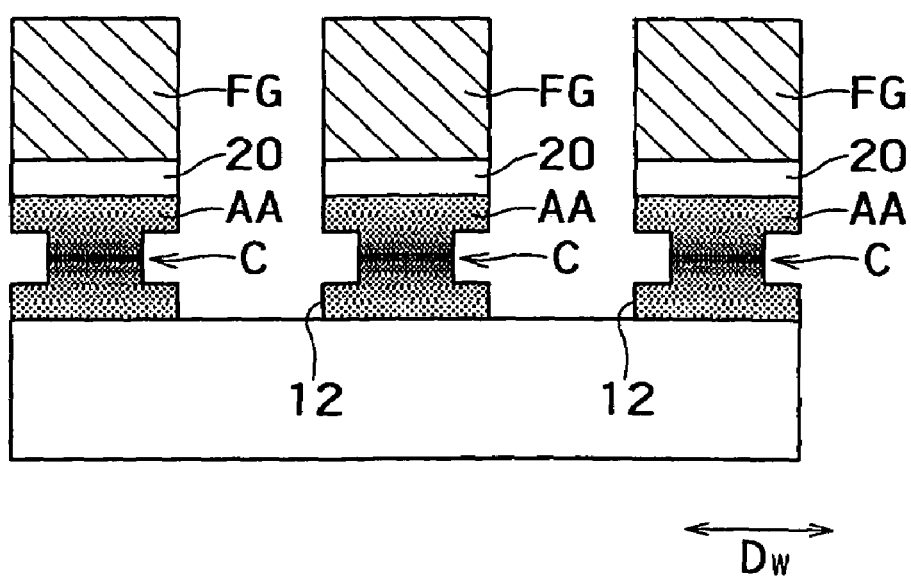
FIG. 21 is a sectional view showing a method of manufacturing the memory following FIG. 120.

FIGS. 20 and 21 are sectional views showing the flow of a method of manufacturing the memory 200. First, a semiconductor substrate 10 shown in FIG. 20 is prepared. The semiconductor substrate 10 comprises a semiconductor bulk 11, silicon-germanium (SiGe) layer 16, and semiconductor layer 17. The semiconductor layer 17 is provided on the silicon-germanium layer 16. Each of the semiconductor bulk 11 and semiconductor layer 17 is made of, e.g., silicon single crystals, and the silicon-germanium layer 16 is a mixed layer of germanium and silicon. The semiconductor substrate 10 can be formed by ion-implanting germanium into a silicon substrate. Alternatively, the semiconductor substrate 10 may be formed by epitaxially growing a silicon crystal with mixing germanium on the semiconductor bulk 11 and epitaxially growing silicon single crystals without containing germanium.

Then, a material for first gate insulating films 20, a material for floating gate electrodes FG, and a mask material 15 are formed in this order on the semiconductor substrate 10, similarly to the first embodiment.

As shown in FIG. 21, a plurality of trenches 12 are so formed as to extend through the material for the floating gate electrodes FG, that for the first gate insulating films 20, the semiconductor layer 17 and the silicon-germanium layer 16, and reach the semiconductor bulk 11. The trenches 12 are formed by, e.g., RIE using the mask material 15 as a mask. Since the etching rate of the silicon-germanium layer 16 is higher than those of the semiconductor layer 17 and semiconductor bulk 11, the silicon-germanium layer 16 is selectively etched. As a result, the silicon-germanium layer 16 is laterally etched, and the recesses C are formed in side walls of the active areas AA. After the steps in the first embodiment described with reference to FIGS. 7 and 8(A), the memory 200 is completed. As described above, with the silicon-germanium layer 16 in the active areas AA, the recesses C can be easily formed in side walls of the active areas AA.

Figure 22:
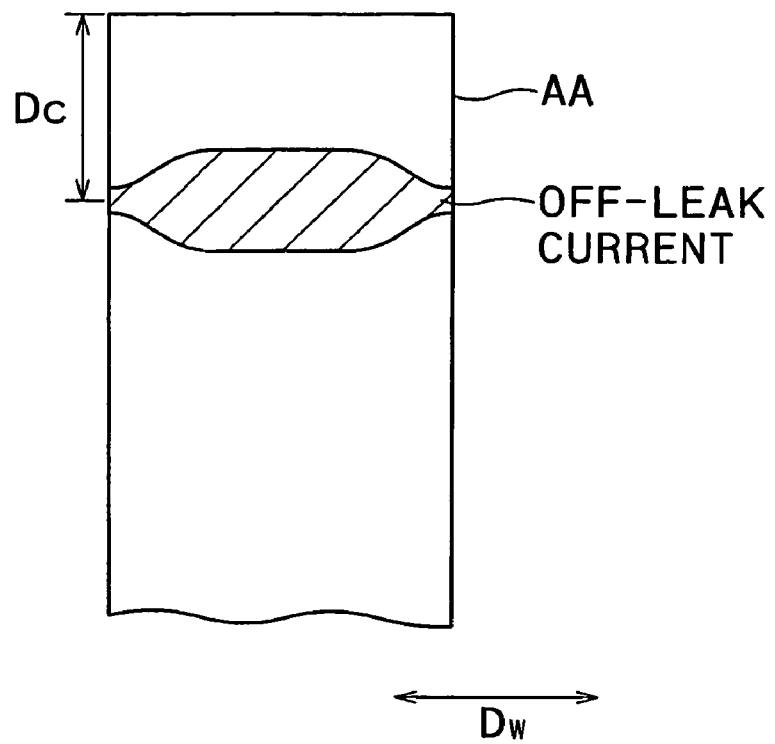
FIG. 22 is a sectional view showing an area where an off-leak current flows.

Generally, as shown in FIG. 22, an off-leak current flows at a depth $D_C$ from the surface of each active area AA. The depth $D_C$ is about equal to or deeper than that where an extension layer is located, depending on the impurity profile of the active area AA.

According to the third embodiment, each recess C is formed at a depth equal to that where an off-leak current flows in the corresponding active area AA. As a result, an off-leak current which flows in the vicinity of side walls of the active area AA can be eliminated. If a taper TP is formed in each of the floating gate electrodes FG, as in the first and second embodiments, an off-leak current increases in this region. This embodiment has the effect of suppressing the increase. The effect will be explained in detail in the explanation of the fourth embodiment.

When trenches for STIs are formed, side walls of each active area are generally forward tapered. More specifically, the width of each active area at its sides increases from the top portion to the bottom portion in a section taken in a direction perpendicular to a direction in which the STIs extend. Accordingly, with a conventional manufacturing step, each recess C cannot be formed in a side of the corresponding active area AA, unlike this embodiment.

Fourth Embodiment

FIGS. 23(A) and 23(B) are sectional views of a NAND-type flash memory 300 (to be also simply referred to as the memory 300 hereinafter) according to the fourth embodiment of the present invention. FIG. 23(A) is comparable to a sectional view taken along the line A-A shown in FIG. 1; and FIG. 23(B) is comparable to a sectional view taken along the line B-B shown in FIG. 1. The fourth embodiment is a combination of the second embodiment and the third embodiment. Accordingly, the fourth embodiment has the effects of both the second embodiment and the third embodiment.

Figure 24:
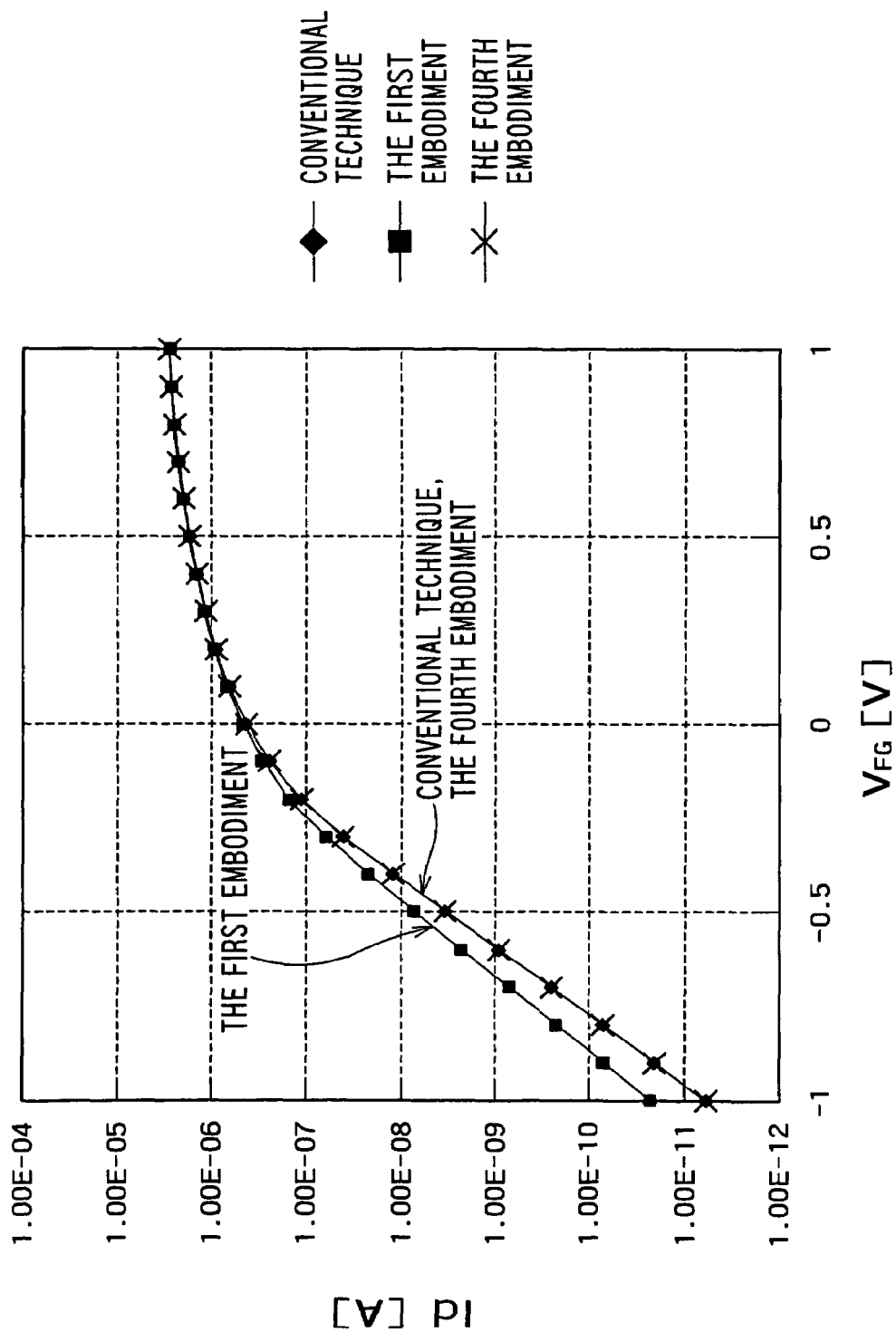
FIG. 24 is a graph showing the relationship between a self-potential $V_{FG}$ of floating gate electrodes FG and a drain current Id which flows between diffusion layers 40.

FIG. 24 is a graph showing the relationship between a self-potential $V_{FG}$ of floating gate electrodes FG and a drain current Id which flows between diffusion layers 40. Referring to this graph, when, for example, $V_{FG}$ was −0.5 V, Id in the first embodiment was about 7.31 nA, and Id in the fourth embodiment or a conventional example was about 3.58 nA. This means that an off-leak current in the first embodiment is larger than those in the fourth embodiment and conventional example.

In the first embodiment, the tapers TP are formed in side walls of the floating gate electrodes FG. For this reason, each floating gate electrode FG and the corresponding active area AA do not face each other in the vicinity of the side walls of the active area AA. This may cause an increase in off-leak current in the vicinity of side walls of each active area AA.

To cope with this, in the fourth embodiment, each of recesses C is formed at a position in the vicinity of side walls of the corresponding active area AA where an off-leak current flows. With this arrangement, an increase in off-leak current can be prevented. As described above, the fourth embodiment can not only obtain the effects of the first or the second embodiment and the third embodiment by combining the embodiments but also effectively prevent an increase in off-leak current caused by introduction of the first or the second embodiment.

Figure 25:
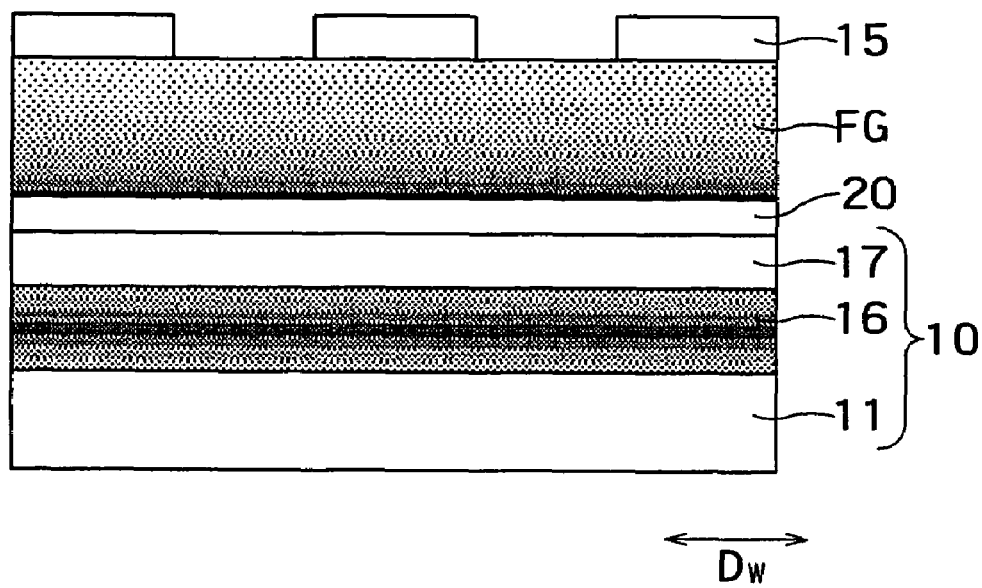
FIG. 25 is a sectional view showing a method of manufacturing the memory 300.
Figure 26:
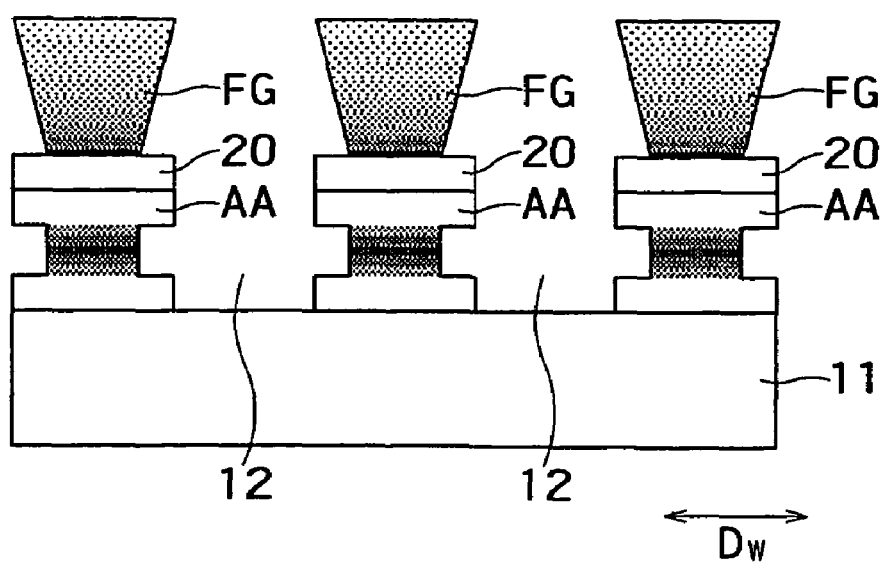
FIG. 26 is a sectional view showing a method of manufacturing the memory 300 following FIG. 25.

FIGS. 25 and 26 are sectional views showing the flow of a method of manufacturing the memory 300. First, as shown in FIG. 25, a semiconductor substrate 10 is prepared. The semiconductor substrate 10 may be the same as that in the third embodiment. Accordingly, the semiconductor substrate 10 comprises a semiconductor bulk 11, silicon-germanium layer 16, and semiconductor layer 17. Then, a material for first gate insulating films 20, a material for the floating gate electrodes FG, and a mask material 15 are formed in this order on the semiconductor substrate 10 in the same manner as in the second embodiment. In depositing the material for the floating gate electrodes FG, germanium is mixed into a gas used in the deposition step, similarly to the second embodiment. At this time, the mixed amount of germanium is large at the beginning of the deposition step and gradually decreases. With this operation, the concentration of germanium increases from the top surface of the material for the floating gate electrodes FG to the bottom surface.

Next, as shown in FIG. 26, a plurality of trenches 12 are so formed as to extend through the material for the floating gate electrodes FG, that for the first gate insulating films 20, the semiconductor layer 17, and the silicon-germanium layer 16 and reach the semiconductor bulk 11. The trenches 12 are formed by, e.g., RIE using the mask material 15 as a mask. Since the reaction rate is different between silicon and Ge, tapers TP are formed at side walls of the floating gate electrodes FG, similarly to the second embodiment. The recesses C are formed in side walls of the active areas AA. After the steps in the first embodiment described with reference to FIGS. 7 and 8(A), the memory 300 is completed.

Figure 27:
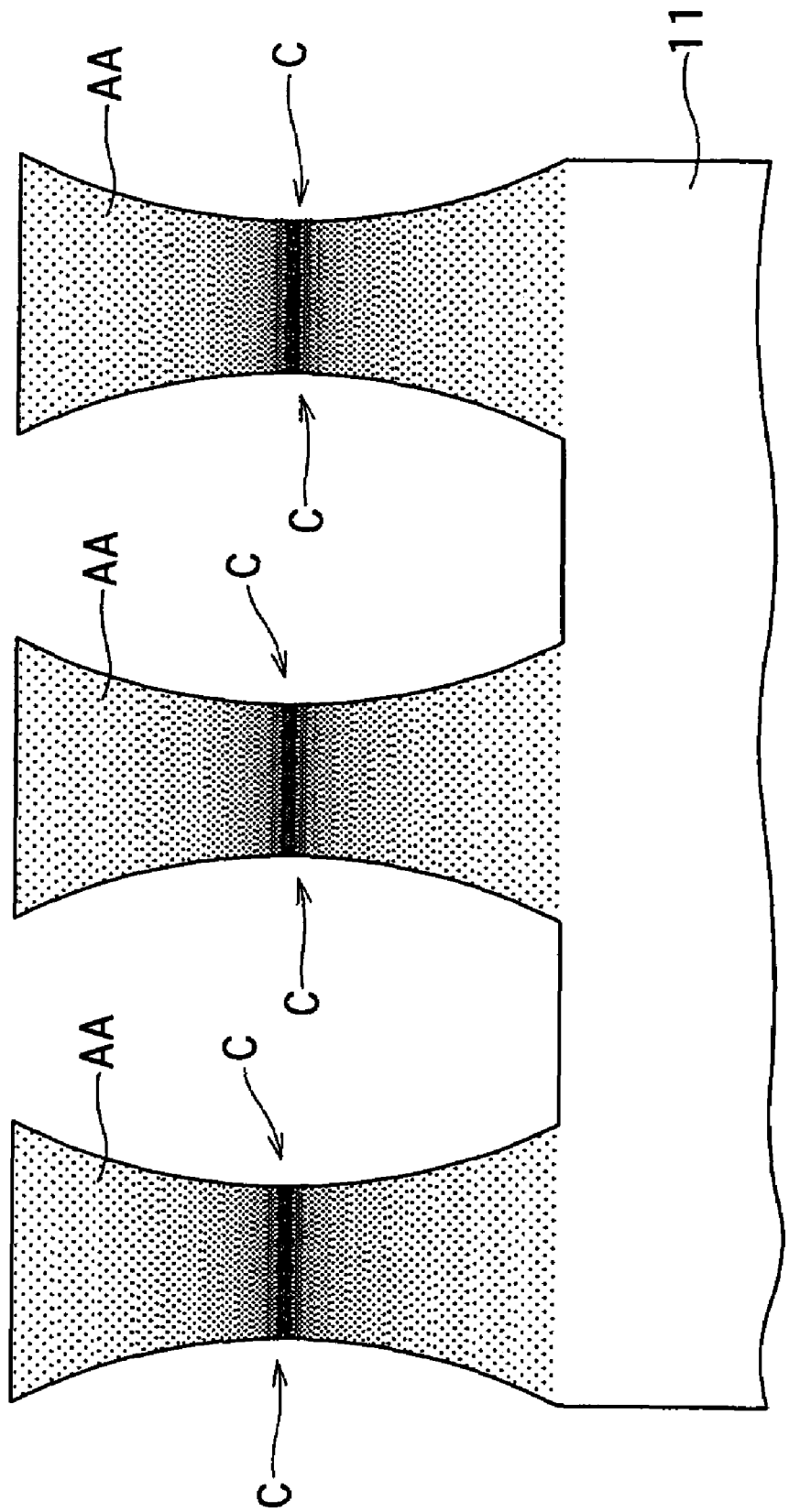
FIG. 27 is a sectional view showing a modification of the recess C.

Note that in the third and fourth embodiments, the shape of each recess C is rectangular, the present invention is not limited to this. For example, the recess C may be curved or arc-shaped, as shown in FIG. 27. At this time, each active area is hand drum-shaped. With this shape, it becomes easy to suppress an off-leak current.

Each recess C may be formed in a part of a side wall of the corresponding active area AA. Alternatively, the recess C may be formed across the side wall of the active area AA, as shown in FIG. 27. Note that it is necessary not to narrow the surface region of each active area AA.

According to the fourth embodiment, in the etching step of forming the trenches 12 for STIs, the tapers TP of the floating gate electrodes FG and the recesses C of the active areas AA are simultaneously formed in a self-aligned manner. Accordingly, with the manufacturing method according to the fourth embodiment, the memory 300 can be manufactured easily.

In addition, the silicon-germanium layer 16 can be formed only by adding a germanium implantation step or mixing germanium in an additional epitaxial step. In the deposition step of the material for the floating gate electrodes FG, germanium only needs to be mixed. Accordingly, the manufacturing method according to the fourth embodiment can be implemented only by adding an epitaxial step to a conventional manufacturing method. Instead of Ge, the first element with a different reactivity to Si can be used. At this time, it is desirable to select a reactive gas so as to adjust the reaction rate ratio between the first element and silicon. This makes it possible to select whether to form the tapers TP in the floating gate electrodes FG in either one or both of directions $D_L$ and $D_W$.

Fifth Embodiment

Figure 28B:
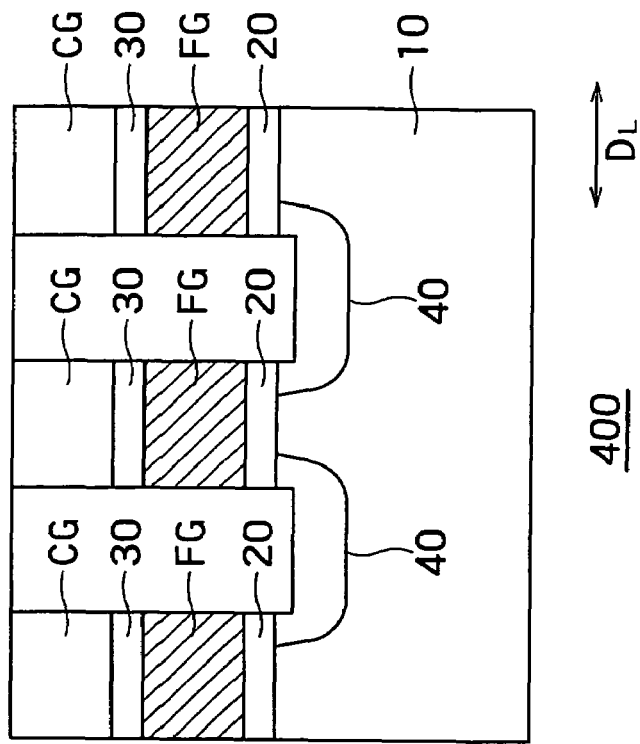
FIG. 28 is a sectional view of a memory 400 according to the fifth embodiment of the present invention.
Figure 28A:
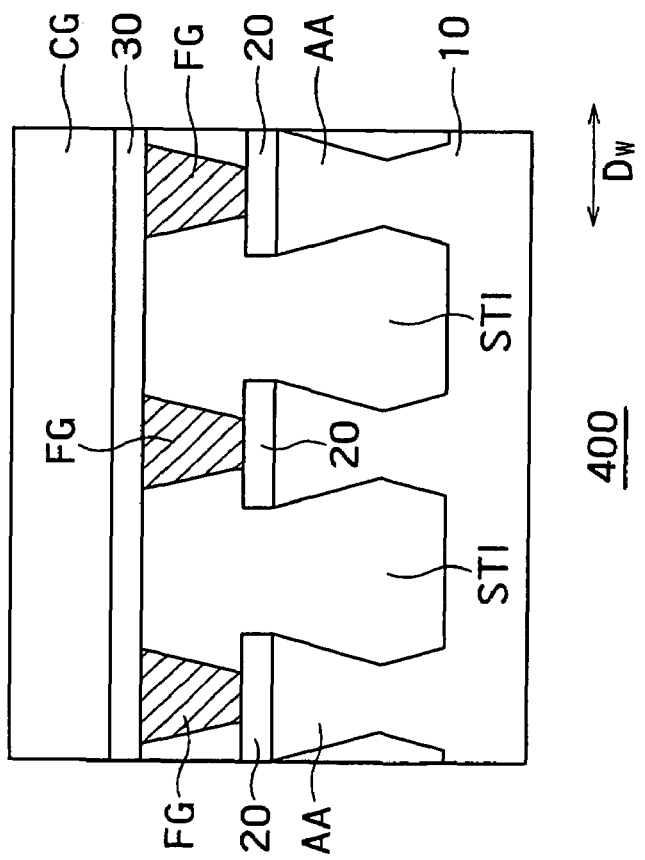

FIG. 28 is a sectional view of a memory 400 according to the fifth embodiment of the present invention. The memory 400 is different in the shape of recesses C from the memory 300 shown in FIG. 23(A). However, the effects of the memory 400 are the same as those of the memory 300, and only a manufacturing method therefor will be explained.

Figure 31:
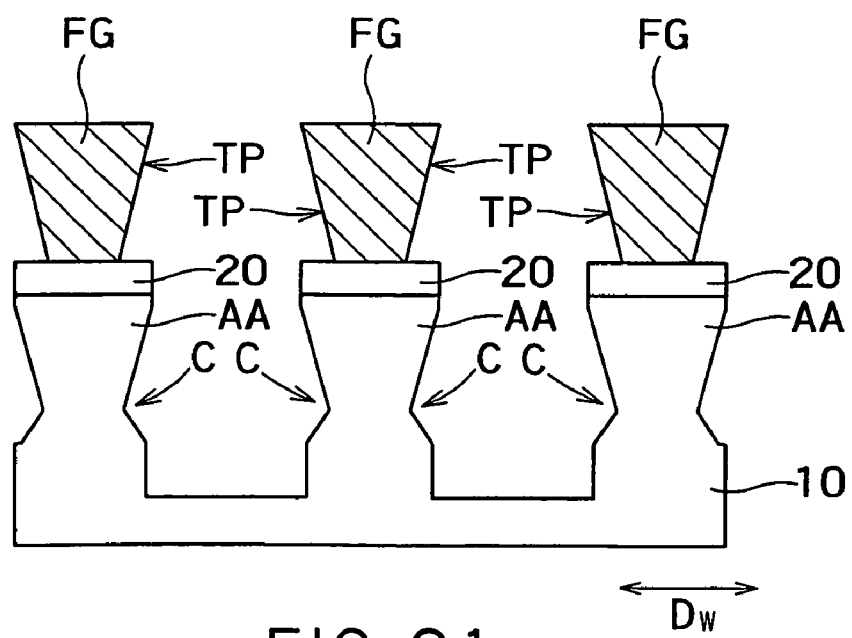
FIG. 31 is a sectional view showing a method of manufacturing the memory 400 following FIG. 30.
Figure 29:
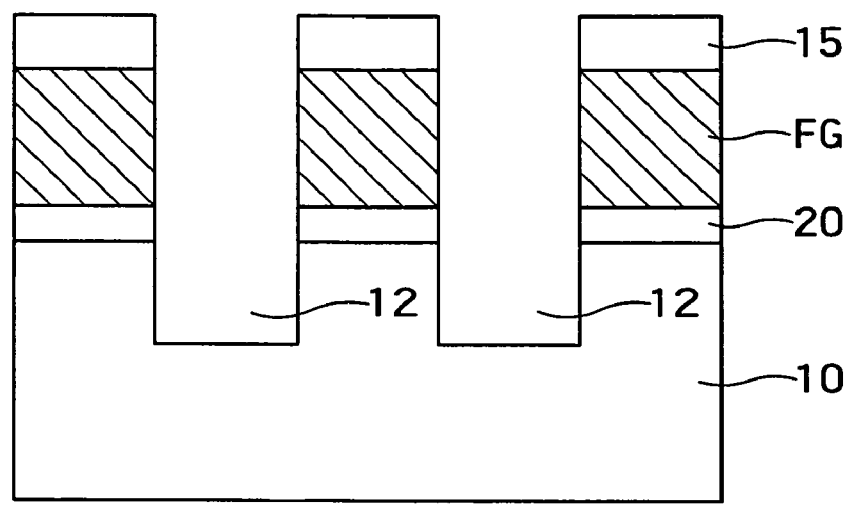
FIG. 29 is a sectional view showing a method of manufacturing the memory 400.
Figure 30:
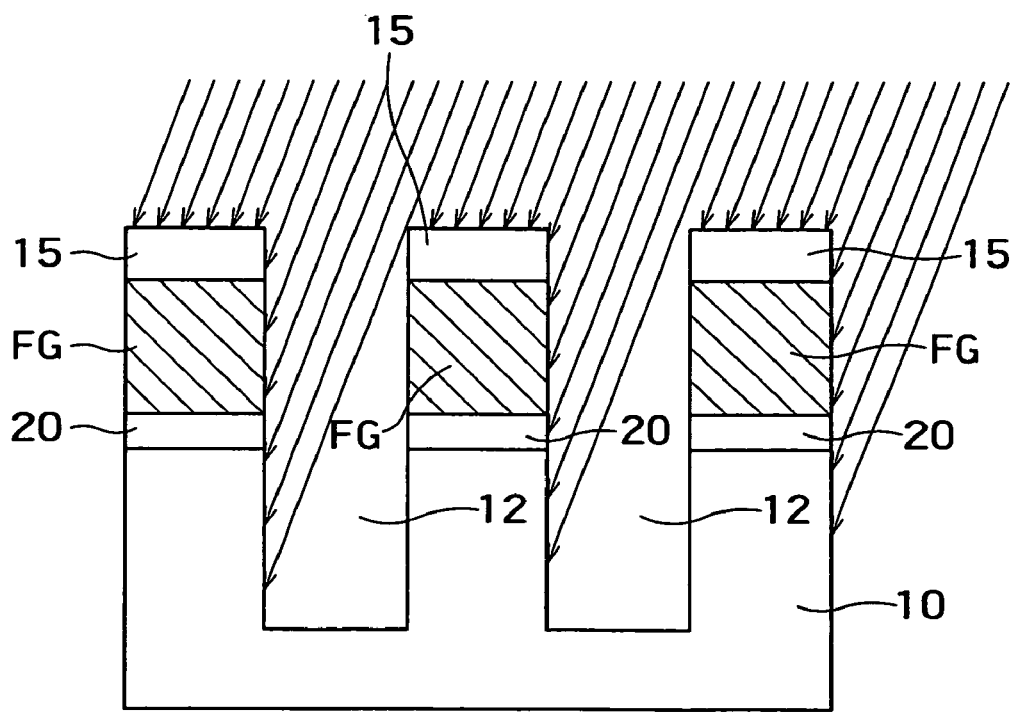
FIG. 30 is a sectional view showing a method of manufacturing the memory 400 following FIG. 29.

FIGS. 29 to 31 are sectional views showing the flow of a method of manufacturing the memory 400. In the fourth embodiment described above, the tapers TP and recesses C are formed utilizing a change in the concentration of germanium. In the fifth embodiment, tapers TP and the recesses C are formed by an oblique etching. Note that FIGS. 28(A) and 29 to 31 show a section taken in a direction along the line A-A in FIG. 1.

First, a material for first gate insulating films 20, a material for floating gate electrodes FG, and a mask material 15 are formed in this order on a semiconductor substrate 10, similarly to the first embodiment. Then, trenches 12 shown in FIG. 29 are formed. The trenches 12 are formed in the same manner as those in the first embodiment. The recesses C are preferably formed at a depth equal to that where an off-leak current flows, as shown in FIG. 31.

Next, as shown in FIG. 30, one of two side walls of each floating gate electrode FG and one of two side walls of each trench 12 are anisotropically etched in an inclined direction. This etching may be the same as that described with reference to FIG. 4. Since in this embodiment, not only the one of the two side walls of each floating gate electrode FG but also the one of the two side walls of each trench 12 are etched, it is necessary to adjust the incident angle of an etching gas, the thickness of the floating gate electrodes FG, or the thickness of the mask material 15.

Then, the other of the two side walls of the floating gate electrode FG and the other of the two side walls of the trench 12 are subjected to oblique etching in the same manner. As a result, the two side walls of the floating gate electrodes FG each have the corresponding taper TP, and those of the trenches 12 each have the corresponding recess C, as shown in FIG. 31. After the steps described with reference to FIGS. 7 and 8(A), the memory 400 is completed.

According to the fifth embodiment, a NAND-type flash memory having the same effects as in the fourth embodiment can be formed using a general bulk silicon substrate not containing germanium.

Figure 32B:
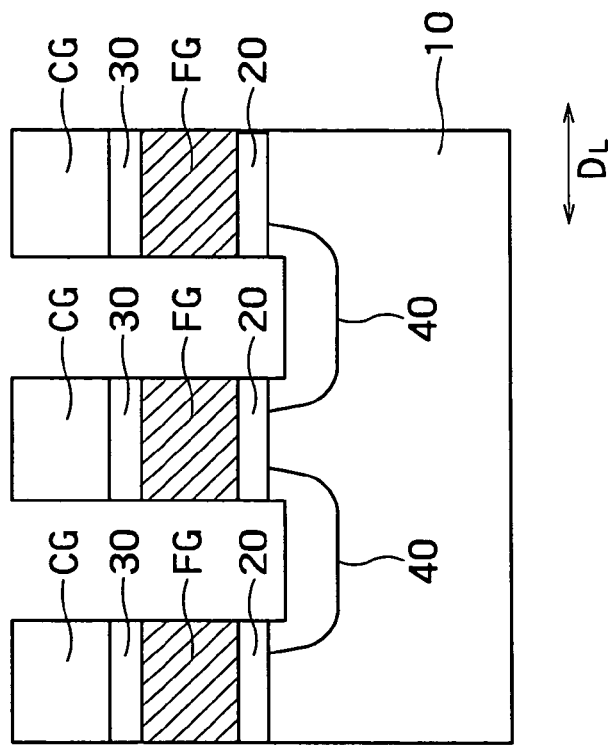
FIGS. 32(A) and 32(B) are sectional views showing a modification of a fifth embodiment.
Figure 32A:
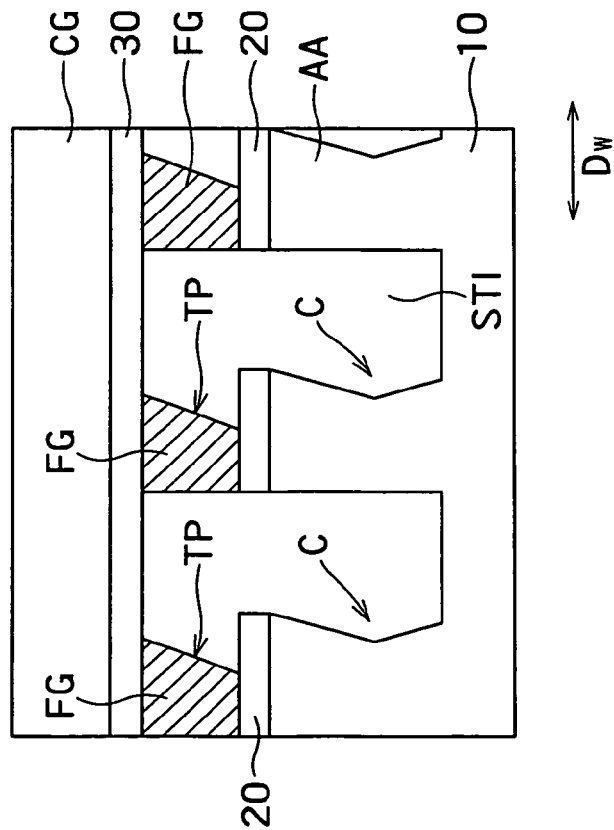

In the fifth embodiment, side walls of the floating gate electrodes FG and those of the trenches 12 are formed using oblique etching. Accordingly, as shown in FIGS. 32(A) and 32(B), each taper TP can be formed only at one of two side walls of the corresponding floating gate electrode FG, and each recess C can be formed only at one of two side walls of the corresponding trench 12.

The fifth embodiment can be combined with the first modification of the first embodiment. This makes it possible to form the recesses C in side walls of the trenches 12 as well as form the tapers TP at the four side walls of the floating gate electrodes FG.

Note that plan views of the memories 200, 300 and 400 according to the third to fifth embodiments are omitted because they are the same as that shown in FIG. 1.

In the above-described embodiments, the tapers TP are formed at side walls of the floating gate electrodes FG. The present invention can be applied to not only a floating gate electrode of a memory cell but also a gate electrode of a MOSFET, and the overlap capacitance can be reduced. Consequently, the flexibility in transistor design increases.

Figure 33:
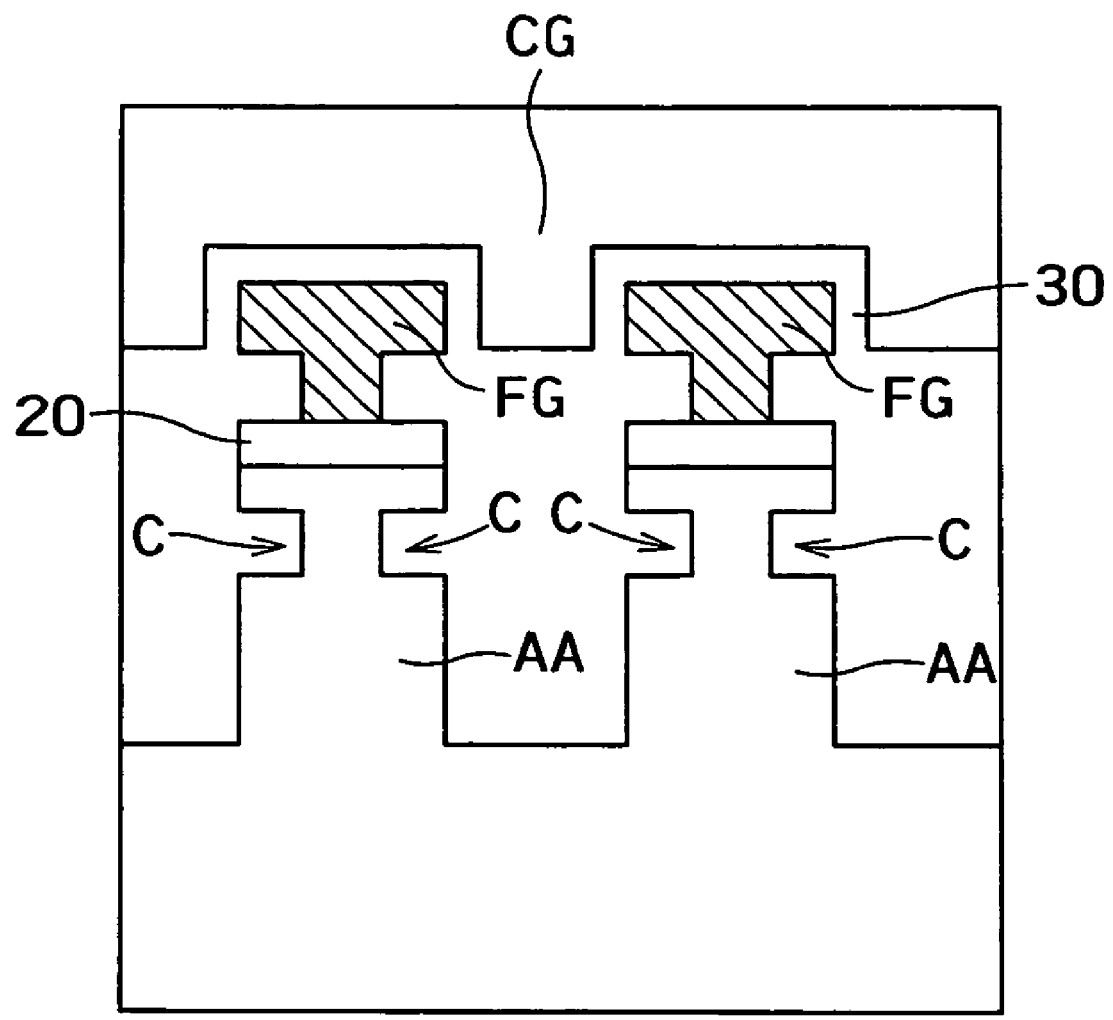
FIG. 33 is a sectional view showing a floating gate FG formed to have a T-shape as any one of modifications of the second to the fourth embodiments.

The tapers TP of the floating gate electrodes FG according to the second to fourth embodiments can be adjusted by controlling the concentration distribution of Ge. At this time, each floating gate FG can be formed to have a T-shape, as shown in FIG. 33.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A manufacturing method of a nonvolatile semiconductor storage device comprising:
    forming a first gate insulating film on a semiconductor substrate;
    depositing a material for floating gate electrodes on the first gate insulating film;
    forming a plurality of trenches which extend through the material for the floating gate electrodes and the first gate insulating film and reach the semiconductor substrate;
    etching side walls of the material for the floating gate electrodes to form the floating gate electrodes such that a lower hem of the material for the floating gate electrodes facing an element-forming region is narrower than a width of a surface of the element-forming region in a section taken in a direction perpendicular to a direction in which the trenches extend;
    forming second gate insulating films on the floating gate electrodes; and
    forming control gate electrodes on the second gate insulating films.

2. The manufacturing method of the nonvolatile semiconductor storage device according to claim 1, wherein, when forming the floating gate electrodes, the side walls of the material for the floating gate electrodes are anisotropically etched in a direction inclined with respect to the side walls.

3. The manufacturing method of the nonvolatile semiconductor storage device according to claim 2, wherein, when forming the floating gate electrodes, the side walls of the material for the floating gate electrodes and side walls of the element-forming region are anisotropically and simultaneously etched in a direction inclined with respect to the side walls of the material for the floating gate electrodes in the section taken in the direction perpendicular to the direction in which the trenches extend.

4. The manufacturing method of the nonvolatile semiconductor storage device according to claim 1, wherein, when depositing the material for the floating gate electrodes, a mixing ratio of a first element contained in the deposition gas is raised at the beginning of the deposition step, and then a mixing ratio of a second element is raised, such that a content of the first element is higher in the vicinity of a bottom surface of the material for the floating gate electrodes than in the vicinity of a top surface, the second element having a lower reactivity to an etching gas than the first element.

5. The manufacturing method of the nonvolatile semiconductor storage device according to claim 4, wherein the first element is germanium, and the second element is silicon.

6. The manufacturing method of the nonvolatile semiconductor storage device according to claim 1, wherein the nonvolatile semiconductor storage device is a NAND-type flash memory.

7. A manufacturing method of a nonvolatile semiconductor storage device comprising:
    forming a first gate insulating film on a semiconductor substrate;
    depositing a material for floating gate electrodes on the first gate insulating film;
    forming a plurality of trenches which extend through the material for the floating gate electrodes and the first gate insulating film and which reach the semiconductor substrate, and forming an element-forming region in which a width of at least a part of a body is narrower than a width of a top surface in a section taken in a direction perpendicular to a direction in which the trenches extend;
    forming a second gate insulating film on the material for the floating gate electrodes; and
    forming a control gate electrode on the second gate insulating film.

8. The manufacturing method of the nonvolatile semiconductor storage device according to claim 7, wherein the semiconductor substrate comprises a mixed layer which is provided on a semiconductor bulk and which contains a first element and a second element, and a semiconductor layer which is provided on the mixed layer and which has a mixing ratio of the first element lower than a mixing ratio of the first element of the mixed layer, and when forming the element-forming region, the plurality of trenches are so formed as to extend through the material for the floating gate electrodes, the first gate insulating film, the semiconductor layer, and the mixed layer and as to reach the semiconductor bulk, and a width of the body of the element-forming region is formed to be narrower than the width of the top surface of the element-forming region by selectively etching the mixed layer.

9. The manufacturing method of the nonvolatile semiconductor storage device according to claim 8, wherein the first element is germanium, and the second element is silicon.

10. The manufacturing method of the nonvolatile semiconductor storage device according to claim 7, wherein a recess provided on side walls of the element-forming region is formed at a depth of an extension layer being a part of a diffusion layer which overlaps at both ends of the floating gate electrode, or is formed at a deeper level than the depth of the extension layer.

* * * * *